(12) United States Patent
Raab

(10) Patent No.: US 6,552,634 B1
(45) Date of Patent: Apr. 22, 2003

(54) WIDEBAND, MINIMUM-RATING FILTERS AND MULTICOUPLERS FOR POWER AMPLIFIERS

(76) Inventor: Frederick Herbert Raab, Green Mountain Radio Research Company, 50 Vermont Ave., Colchester, VT (US) 05446

(*) Notice: Subject to any disclaimer, the term of this patent is extended or adjusted under 35 U.S.C. 154(b) by 254 days.

(21) Appl. No.: 09/676,525

(22) Filed: Oct. 2, 2000

Related U.S. Application Data

(62) Division of application No. 09/138,956, filed on Aug. 24, 1998, now Pat. No. 6,252,461.
(60) Provisional application No. 60/056,424, filed on Aug. 25, 1997.

(51) Int. Cl.[7] ................................................ H03F 3/04
(52) U.S. Cl. ..................... 333/216; 330/53; 330/124 R; 330/302; 333/32; 333/213; 333/214
(58) Field of Search .......................... 333/32, 213, 214, 333/216; 330/53, 124 R, 302

(56) References Cited

U.S. PATENT DOCUMENTS

| | | | |
|---|---|---|---|
| 2,429,649 A | | 10/1947 | Romander |
| 3,927,280 A | * | 12/1975 | Gupta ........................ 333/216 |
| 5,163,181 A | | 11/1992 | Koontz |
| 5,546,057 A | | 8/1996 | Pfitzenmaier |
| 5,689,219 A | | 11/1997 | Piirainen |
| 6,254,661 B1 | * | 6/2001 | Raab ........................ 330/302 |

OTHER PUBLICATIONS

T.R. Cuthbert, Jr., Broadband impedance matching techniques, R. F. Design, vol. 17, No. 8, pp. 64–71, Aug. 1994.
H.J. Carlin, A new approach to gain–bandwidth problems, IEEE Trans. Circuits Systems, vol. CAS–24, No. 4, pp. 170–175, Apr. 1977.
E. Franke, Simple compensation of the single–section quarter–wave matching section, R.F. Design, vol. 15, No. 1, pp. 38–46, Jan. 1992.
R.J. Dehoney, Program synthesizes antenna matching networks for maximum and width, R.F. Design, vol. 18, No. 5, pp. 74–81, May 1995.
R.M. Fano, Theoretical limitations on the broadband matching of arbitrary impedances, J. Franklin Inst., vol. 249, pp. 57–83, Jan. 1950.
R.M. Fano, Theoretical limitations on the broadband matching of arbitrary impedances, J. Franklin Inst., vol. 249, pp. 139–154, Feb. 1950.
K. Cosaki and Y. Akaiwa, Nonlinearity compensation of linear power amplifier for mobile communication, Record Fourth IEEE Int. Conf. Universal Personal Commun., Tokyo, pp. 302–305, Nov. 6–10, 1995.
K. Meinzer, A linear transponder for amateur radio satellites, VHF Communications, vol. 7, pp. 42–57, Jan. 1975.
L. Kahn, Single sideband transmission by envelope elimination and restoration, Proc. IRE, vol. 40, No. 7, pp. 803–806, Jul. 1952.

(List continued on next page.)

Primary Examiner—Michael B Shingleton

(57) ABSTRACT

A method and a circuit for power amplification over a wide frequency range based upon the use of minimum-rating filters or matching networks, negative-component signal processing, and single or multiple amplifiers. The filters and matching networks are preferably designed to minimize the required ratings of the amplifier(s) driving them. The signal processor or generator preferably uses negative components to produces a driving signal that is compensated for the ripple in the filter, matching network, and load. The outputs of multiple amplifiers optimized for different frequency ranges can be combined into a single load with flat frequency response, resistive loads presented to the amplifiers, and no inherent power loss in the combining network.

22 Claims, 24 Drawing Sheets

OTHER PUBLICATIONS

F.H. Raab and D.J. Rupp, High-efficiency single-sideband HF/VHF transmitter based upon envelope elimination and restoration, Proc. Sixth Int. Conf. HF Radio Systems and Techniques (HF '94), York, UK, pp. 21–25, Jul. 4–7, 1994.

F.H. Raab, B.E. Sigmon, R.G. Myers and R.M. Jackson, High-efficiency L-band Kahn technique transmitter, Int. Microwave Symp. Digest. vol. 2, Baltimore, MD, pp. 585–588, Jun. 7–12, 1998.

F.H. Raab, Intermodulation distortion in Kahn-technique transmitters, IEEE Trans. Microwave Theory Tech., vol. 44, No. 12, part 1, pp. 2273–2278, Dec. 1996.

J.R. Hall, The transmitter combiner, Communications, pp. 30–32, Mar. 4, 1970.

R. Levy and K. Andersen, HF diplexer with helical resonators, Applied Microwave Mag, vol. 4, No. 2, pp. 76–87, Summer 1992.

J.R. Witmer, A modular two-band diplexer, R.F. Design, vol. 14, No. 13, pp. 30–34, Dec. 1991.

H.L. Krauss, C.W. Bostian and F.H. Raab, Solid State Radio Engineering, John Wiley and Sons, New York, 1980, Section 12–7 and Section 16–5.

A.I. Zverev, Handbook of Filter Synthesis, John Wiley and Sons, New York, 1967, pp. 312, 313, 314.

W.-K. Chen, Broadband Matching Theory and Implementations, Second Edition, World Scientific, New Jersey, 1988, Chapter 4—Section 1, 2, 3, and Chapter 6—Section 3 and 4.

P.L.D. Abrie, The Design of Impedance-Matching Networks for Radio-Frequency and Microwave Amplifiers, Artech House, Dedham, Massachusetts, 1985, Chapter 6—pp. 161–239.

* cited by examiner

121

122

123

124

125

125

WIDEBAND, MINIMUM-RATING FILTERS AND MULTICOUPLERS FOR POWER AMPLIFIERS

DESCRIPTION

This application is related to U.S. Provisional Patent Application Serial No. 60/056,424, "Technique for Combining Outputs of Power Amplifiers Operating in Adjacent Frequency Bands," filed on Aug. 25, 1997. This is division of Ser. No. 09/138,956, filed Aug. 24, 1998 now U.S. Pat. No. 6,252,461.

TECHNICAL FIELD

The present invention relates to the field of amplifiers for audio, radio, and microwave frequencies, used in conjunction with filters, matching networks, and power combiners in systems such as transmitters, and more specifically to methods for enabling power amplifiers and their associated output networks and power combiners to operate safely and efficiently and with substantilly flat frequency responses over wider bandwidths than would otherwise be possible.

BACKGROUND ART

The production of high-power electronic signals is required in a variety of applications, including radio, microwave, audio, and servo amplifiers. Applications for radio and microwave power amplifiers include communications, broadcasting, and magnetic-resonance imaging. Typical applications for audio power amplifiers include communications, home entertainment, and sonar. Servo amplifiers are used for various control and positioning applications.

Electronic amplifiers are often required to operate over a wide bandwidth. An output filter is often required to prevent harmonics from reaching the load, and a matching network is often required between the load and the amplifier to provide the amplifier with a suitable load impedance. In many cases, multiple amplifiers operating in different frequency bands are employed to allow a system to operate over a large range of frequencies. It is also desirable for power amplifiers (amplifiers that produce a significant output power) to operate with high efficiency. The amplifier characteristics required to achieve these various performance goals often conflict with each other, hence designing such amplifiers using conventional techniques involves inherent trade-offs and limitations in achievable performance.

One example is an audio-frequency (AF) power amplifier (PA) driving a speaker. The resistance and inductance in the speaker form a low-pass filter, but it is desirable to maintain a flat frequency response to frequencies higher than the corner-frequency of the speaker. A second example is a radio-frequency (RF) power amplifier that drives an antenna through a matching network of limited bandwidth. The bandwidth of the matching network can prevent production of wideband signals such as spread-spectrum modulation. A third example is a modern solid-state radio transmitter that selects one output filter from a bank of filters that cover the operating frequency range of the transmitter. A relatively small filter bandwidth results in the need for a large number of filters. A fourth example is a transmitter system that employs separate HF and VHF PAs, but combines their outputs into the same antenna. A fifth example is the Meinzer modulator that uses a class-S amplifier to amplify the low-frequency components efficiently and a class-B amplifier to add the high-frequency components.

The prior art, reviewed in detail subsequently, has at least three significant limitations in these areas. Existing techniques for broadband filters and matching networks are based upon optimizing variation of gain or minimizing standing-wave ratio (SWR), but do not provide minimum voltage and current ratings for the the amplifiers that drive them. Signal-processing techniques that flatten the gain are typically based upon feedback and therefore have inherent trade-offs between the amount of gain flattening, stability, and bandwidth. Prior-art techniques for combining power amplifiers that operate on different frequencies are either lossy or require the bands to be noncontiguous.

Broadband Filters and Matching Networks

Output filters and matching networks are integral components of most amplifier systems. Filters are required to prevent the harmonics generated by power amplifiers from reaching the load. Matching networks are required because the load impedance for which the power amplifier can efficiently deliver the desired power is generally different from that of the load (e.g., antenna) into which the power must be delivered. Even small-signal amplifiers must generally be matched to the load to deliver the maximum output signal. However, the filter and matching networks impose limits on the bandwidth of the transmitter or amplifier system.

FIG. 1, FIG. 2, and FIG. 3 show an example of prior-art techniques for increasing the bandwidth. In FIG. 1, amplifier 2 drives load 9 through a series-tuned filter circuit consisting of inductor 4 and capacitor 5 with $Q_1=3.5$ to provide adequate suppression of harmonics. As shown in the Smith-chart plot of FIG. 3, the PA-load impedance 3 exits the 2:1 SWR circle 12 at approximately 0.9041 and 1.1061 MHz, resulting in a passband ratio of 1.1061/0.9041=1.223 for a 2:1 SWR.

In this example, broadbanding is accomplished by adding a parallel-tuned circuit consisting of inductor 6 and capacitor 7 between the series-tuned circuit and the load. When the values L2 and C2 are properly chosen, the locus of the PA-load impedance 11 in FIG. 3 now loops around within the 2:1 SWR circle and exits the circle 11 at 0.8673 and 1.1529 MHz, resulting in a larger passband ratio of 1.329.

The implementation of broadband filters and matching networks is a well-known technology that is taught In textbooks by P. L. D. Abrie (*The Design of Impedance-Matching Networks for Radio-Frequency and Microwave Amplifiers*, Dedham, Mass., Artech House, 1985) and W. K. Chen (*Broadband Matching: Theory and Implementation*, Teaneck, NJ, World Scientific, 1989) and numerous articles, for example T. R. Cuthbert, Jr., "Broadband impedance matching techniques" *R. F. Design*, vol. 17, no. 8, pp. 64–71, August 1994. A number of different methods for determining the values of the components have been developed, and the "real-frequency" technique developed by H. J. Carlin ("A new approach to gain-bandwidth problems," *IEEE Trans. Circuits Syst.*, vol. CAS-24, no. 4, pp. 170–175, April 1977) is one of the most popular. Applications (e.g., E. Franke, "Simple compensation of the single-section quarter-wave matching section," *R. F. Design*, vol. 15, no. 1, pp. 38–46, January 1992) and calculation programs (e.g., R. J. Dehoney, "Program synthesizes antenna matching networks for maximum bandwidth," *R. F. Design*, vol. 18, no. 5, pp. 74–81, May 1995) abound in the literature.

All of the existing techniques for the design of broadband filters and matching networks are based upon controlling gain (attenuation) or SWR over a bandwidth. Since the gain of a linear, lossless network and the SWR are directly related, controlling one is equivalent to controlling the other.

For example, the Butterworth characteristic maximizes the bandwidth with a smoothly decreasing gain or smoothly increasing SWR. The Chebyshev characteristic minimizes the ripple in the gain or maximum SWR within a given band with a given number of elements.

All of these techniques are subject to the famous limitation discovered by Fano and described in "Theoretical limitations on the broadband matching of arbitrary impedances," *J. Franklin Inst.*, vol. 249, pp. 57–83, January 1950 and vol. 249, pp. 139–154, February 1950. The Fano limit basically states that regardless of the number of elements added to a network, it is not possible to obtain a perfect match at all frequencies and there is a fundamental trade-off between the bandwidth and the maximum gain ripple or SWR within the pass band. Thus increasing the bandwidth is achieved at the cost of increased gain ripple and increased SWR.

Delivery of power into a filter or matching network (hence the load) is, however, limited by the voltage and current ratings of the amplifier. The amplifier ratings are in turn directly related to the voltage and current that must be applied to the input of the filter or matching network to produce the desired amount of power at its output or load. In spite of the large number of publications in this area, no pre-existing techniques address the issue of of minimizing the input voltage and current so an amplifier can safely deliver maximum power to the load over a specified bandwidth.

Gain Flattening

A lossless filter or matching network implemented with real elements (inductors, capacitors) can produce a perfect match (SWR=1) at only a finite number of frequencies. The imperfect match at other frequencies (SWR>1) implies a variation in gain across the passband.

The principal prior-art technologies for flattening the gain of an amplifier system are (a) manual adjustment of the signal amplitude and (b) a feedback loop. Manual adjustment has obvious limitations in speed. It is applicable only to a single-frequency signal; i.e., a signal whose bandwidth is so small that filter gain does not vary significantly over the bandwidth of the signal.

A feedback system for flattening the gain is depicted in FIG. 4. The input 21 is applied to the positive input 22 of operational amplifier 23, which then drives power amplifier 24. The output from filter 25 passes through directional coupler 26 before reaching output 27 on the load 28. Directional coupler 26 extracts a small sample of the output signal, which is applied to the negative input 29 of operational amplifier 23. As is well-known from control-system theory, variations in system gain whether due to nonlinearity or filter gain are suppressed in proportion to the open-loop gain of the system.

Feedback has been used for some time to correct gain variations. For example, Romander describes a technique for correcting distortion in the modulation process in U.S. Pat. No. 2,429,649 (1947). New variations continue to be developed. For example, K. Oosaki and Y. Akaiwa describe a system of RF feedback in "Nonlinearity compensation of linear power amplifier for mobile communication," *Record Fourth IEEE Int. Conf. Universal Personal Commun.*, Tokyo, pp. 302–305, November 6–10, 1995.

A high loop gain is obviously desirable for flattening the frequency response of the system. However, maintaining stability requires that the loop gain drop to less than unity at frequencies where the phase shift is 180° or more. Phase shifts are inherently associated with the reactive elements in the output filter, and larger numbers of elements associated with more complex filters tend to have larger phase shifts. Consequently, there is a limit to how much gain flattening can be achieved by a feedback system.

Diplexing Combiners

A number of applications require power amplifiers operating in different frequency bands to deliver power to the same load. For example, a single resistively loaded antenna may allow transmission on both HF and VHF, but component restrictions make a single PA covering both HF and VHF impractical or result in compromises in performance. In this case, one PA can be optimized for HF and another for VHF and their outputs combined by a diplexing network.

A second application is found in split-band modulators or amplifiers such as described by Meinzer in "A linear transponder for amateur radio satellites," *VHF Communications*, vol. 7, pp. 42–57, January 1975. The envelope elimination and restoration technique developed by Kahn (Single sideband transmission by envelope elimination and restoration," *Proc. IRE*, vol. 40, no. 7, pp. 803–806, July 1952) achieves linear amplification of an RF signal by combining an efficient but nonlinear RF PA and a high-level amplitude modulator.. Achieving good transmitter efficiency requires an efficient amplitude modulator such as a class-S switching-mode modulator. Systems of this type are described by the inventor in "High-efficiency single-sideband HF/VHF transmitter based upon envelope elimination and restoration," *Proc. Sixth Int. Conf. HF Radio Systems and Techniques (HF'94)*, York, UK, pp. 21–25, Jul. 4–7, 1994. and High-efficiency L-band Kahn-technique transmitter," *Int. Microwave Symp. Digest*, vol. 2, Baltimore, Md., pp. 585–588, Jun. 7–12, 1998.

The class-S modulator has, however, inherent limitation of bandwidth due to its switching frequency and output filter. The resultant limitation of the envelope bandwidth limits the bandwidth of the RF output for a given linearity as described by the inventor in ("Intermodulation distortion in Kahn-technique transmitters," *IEEE Trans. Microwave Theory Tech.*, vol. 44, no. 12, part 1, pp. 2273–2278, December 1996. The split-band modulator combines class-S and linear (e.g., class-B) amplifiers so that the class-S amplifier produces the low-frequency components of the envelope efficiently and the linear amplifier adds the high-frequency components. Since most of the power in the envelope occurs in the the low-frequency components, the efficiency of a split-band modulator is significantly higher than that of a linear modulator.

A third application occurs when two or more transmitters must use the same antenna, but each operates in its own unique frequency band. This situation occurs when two broadcast transmitters share the same tower (described, for example, by J. R. Hall in "The transmitter combiner," *Communications*, pp. 30–32, Mar. 4, 1970) or in a base station for cellular or PCS communication where multiple signals for multiple users must be transmitted.

Direct connection of the power amplifiers causes one to load the other, which in turn produces higher peak voltages, lower output power, lower efficiency, intermodulation distortion, and harmonics. The PAs are therefore generally coupled to the load through a combining networks called a "diplexer" or "multiplexer," referred-to hereafter as a "diplexing combiner." The prior-art for diplexing combiners includes hybrid combiners, channelized combiners, circulators, and wideband networks.

Hybrid transformers are a well-known means for combining signals from two different amplifiers. Hybrid combining is described by the inventor in Section 12–7 of *Solid State Radio Engineering* (New York: Wiley, 1980) and is used in numerous applications, for example by Koontz in U.S. Pat. No. 5,163,181 entitled "Multiple RF signal amplification method and apparatus. Hybrid combining offers the advantage of a resistive load impedance for each PA regardless of what signal is produced by the other, as well as operation of either PA at any frequency. As shown in FIG. 5, two signals 31 and 32 drive two amplifiers 33 and 34. The outputs of the two amplifiers are delivered to hybrid transformer 35, which is coupled to load 38 and dump resistor 36. When the two signals are matched in amplitude and phase, they are (ideally) combined without loss and all power is delivered to the load 38. If, however, two signals of different frequencies are combined, half of the power in each is dissipated in dump resistor 36. Consequently, the hybrid transformer is not a satisfactory means of combining signals of different frequencies when transmitter efficiency is a concern.

Channelized combiners are used when the two PAs operate on specific, different frequencies. A channelized combiner is shown in its simplest form in FIG. 6. Two signals 41 and 42 are again amplified by two separate power amplifiers 43 and 44. The amplifiers are coupled to the load 48 through band-pass filters 45 and 46. Each of these example band-pass filters comprises a single inductor (45A and 46A) and a single capacitor (45B and 46B). The first band-pass filter 45 is tuned to the frequency of signal 41, while the second band-pass filter 46 is tuned to that of signal 42. The filters pass their respective signals to the load without alteration, but present each other with a high impedance and therefore do not load each other. Each PA therefore sees a resistive load impedance (if, of course, the load is resistive) and is isolated from the signal produced by the other PA.

Channelized diplexers are described in a number of articles, for example R. Levy and K. Andersen, "HF diplexer with helical resonators," *Applied Microwave Mag.*, vol. 4, no. 2, pp. 76–87, Summer 1992, and J. R. Witmer, "A modular two-band diplexer," *R. F. Design*, vol. 14, no. 13, pp. 30–34, December 1991. Common to all designs is, however, a significant limitation. Achieving the high out-of-band impedance so that one filter does not load the other requires that the two passbands be separated by a dead band. The channelized diplexer is therefore not suitable when continuous frequency coverage is required.

A variation on the channelized diplexer adds circulators between the filter and the antenna. Examples of this can be found in U.S. patents by Pfitzenmaier (U.S. Pat. No, 5,546,057, "Antenna/filter combiner") and Piirainen (U.S. Pat. No. 5,689,219, "Summing network"). The advantage of the circulator is that signals are coupled between ports only in one direction (e.g., clockwise), hence power reflected by a mismatched load is routed to a dump resistor. The fundamental limitations of the channelized diplexer remain, however. If the filters are eliminated, signals from one PA are coupled to the output of the other, which as noted above is undesirable.

The example diplexing combiner shown in FIG. 7 allows the two PAs to operate over wide ranges in frequency. Signals from sources 51 and 52 are amplified separately by PAs 53 and 54. The first PA 53 is coupled-to the load through low-pass filter 55, which comprises inductors 55A and 55C and capacitor 55B. The second PA 54 is coupled to the load through high-pass filter 56, which comprises capacitors 56A and 56C and inductor 56B. Low-pass filter 55 presents a high impedance to high-frequency signals while high-pass filter 56 presents a high impedance to low-frequency signals. Below the transition frequency, signals from PA 53 pass to the load transparently. Above the transition frequency, signals from PA 54 pass to the load transparently.

The design of broadband diplexers for signal splitting is well understood, and there is an abundance of references on this type of "splitting diplexer," which is also called a "branching" or "invulnerable" filter. As shown in FIG. 8, the output of a single source 61 is applied to low-pass filter 62 and high-pass filter 63. Low-pass filter delivers its output 64 to load 65, while high-pass filter delivers its output 66 to load 67.

Such a splitter is designed (as outlined, for example, by Methot in "Constant impedance bandpass and diplexer filters," *RF Design*, vol. 9, no. 11, pp. 92–99, November 1986) by selecting the same 3-dB cut-off frequency for both filters. The components for a convenient filter characteristic such as Butterworth are the "0-$\Omega$" values from standard tables such as those given by Zverev in *Handbook of Filter Synthesis*, New York: Wiley, 1967. The input admittances are conjugates, resulting in a resistive load impedance for signal source 61 at all frequencies and output gains that follow the desired filter characteristics.

Prior-art techniques such as those for designing the diplexing splitter of FIG. 8 do not apply to designing the diplexing combiner of FIG. 7. For example, "0-$\Omega$" filter values are used and the 0-$\Omega$ ends of the filters are coupled to the load, the frequency responses and PA-load impedances are erratic over a 4:1 range as shown in FIG. 9A and FIG. 9B, respectively. Different but generally similar results are obtained if the 0-$\Omega$ ends of the filters are coupled to the PAs, or if filter values for resistive sources are used. Use of a splitting diplexer such as that of FIG. 7 as the signal source for the system of FIG. 8 results in a flatter system gain, but the PA-load impedances continue to vary erratically near the transition frequency, resulting in inefficient and possibly unstable operation of the PAs.

There therefore exists a need for a combining diplexer that allows continuous frequency coverage, provides flat system gain, and provides the power amplifiers with constant, resistive load impedances.

DISCLOSURE OF THE INVENTION

Disclosed herein is a method and apparatus for operating a system of power amplifiers, filters, matching networks, and combiners over a maximum bandwidth with minimum amplifier ratings for a given output power and with a substantially flat frequency response.

The output of an amplifier is filtered or matched to the load by a new class of "minimum-rating" (MR) filter or matching network. The MR network minimizes the voltage and current required at its input for delivery to its load of a specified amount of power over a specified bandwidth. Equivalently, the MR network maximizes the bandwidth over which a specified amount of power can be delivered without exceeding specified ratings. The MR network thus overcomes a significant limitation of prior-art broadband filters, which are optimized for minimizing gain ripple or SWR over bandwidth.

The drive to an amplifier is preprocessed by a negative-component signal processor (NCSP). The NCSP is implemented through techniques such as a synthesizer and look-up table, active filter (e.g., integrated-circuit), or digital signal processor (DSP) and includes supporting devices such as A/D and D/A converters as needed. The NCSP employs negative inductors and negative capacitors whose values correspond to those of the amplifier-output filter or matching network and equivalent circuit of the load. The negative components are, however, arranged in a mirror image of those in the output filter and load. This form of signal processing has gain and phase characteristics that are exactly opposite to those of the output filter or load network. Consequently, it provides a driving signal that compensates for the effect of the output network, resulting in a substantially flat frequency response for the system.

Multiple amplifiers operating in different frequency bands are combined by driving them through an NCSP and combining their outputs through networks of complementary low- and high-pass filters or band-pass filters. The NCSP causes the signals from the amplifiers to arrive at the filters with the correct amplitudes and phases. The system frequency response is thus flat and the amplifiers are presented with matched (resistive) load impedances.

The first structural embodiment of the invention shown in FIG. 10 uses a minimum-rating network 73 to couple an amplifier 72 to the load 75. Signal source 71 provides signals within a frequency band. Load 74 may consist of resistance 74A only, or a combination of resistive and reactive elements represented here as an equivalent circuit of resistance 74A and series reactance 74B. Network 73, which may be a filter or matching network, provides minimum voltage and current ratings over the frequency band of operation. Network 73 may be fixed and optimized for a known load or adjustable for use with unknown or variable loads.

A second embodiment of the invention is the negative-component signal processor (NCSP), an example of which is shown in FIG. 11. Obtaining a flat frequency response from an amplifier or system of amplifiers may require changing the amplitude and phase of a driving signal to counteract the variations induced by an output filter. An NCSP accomplishes this by behaving as a circuit with one or more negative elements. Since true negative components do not exist, the NCSP realizes their behavior through active circuits such as operational amplifiers, a signal synthesizer with memory, or a digital signal processor.

The third structural embodiment of the invention shown in FIG. 12 preprocesses the input signal 71 with NCSP 81. The output of NCSP 81 is optionally amplified and becomes the drive to final amplifier 72, which is coupled to load 74 through filter/matching network 82. Network 82 is preferably of the minimum-rating design. The components of NCSP 72 correspond to those of load 74 and network 82, resulting in a flat frequency response from signal source 71 to output 75.

FIG. 13 illustrates a variation upon the third embodiment that is well-suited for high-efficiency amplification based upon the Kahn technique (L. R. Kahn, "Single sideband transmission by envelope elimination and restoration," *Proc. IRE*, vol. 40, no. 7, pp. 803–806, July 1952). Linear amplifier 72 in FIG. 12 is replaced by a nonlinear RF amplifier 77 and high-level amplitude modulator 78. NCSP 81 now provides both a phase-modulated carrier to drive RF amplifier 77 and an envelope signal to drive modulator 78. Alternatively, analog input 71 can be replaced by a digital data signal and the NCSP can generate the required waveforms directly. Doherty and outphasing power-amplifier systems can similarly be used.

A fourth embodiment of the invention (FIG. 14) adds to the second embodiment the capability to measure the characteristics of the output network and/or load and to adjust the NCSP accordingly. One method for accomplishing this is to insert a directional coupler 85 between the amplifier and output network as shown. Alternatively, the directional coupler can be inserted between the output network and the load at 87. The directional coupler samples forward- and reverse-direction signals, which are detected and optionally processed to extract impedance or reflection coefficient by detector 86. Alternately, a circuit for measurement of the amplitudes and phases of the output voltage and current can be used in place of directional coupler 85. The measurements are delivered to the NCSP for use in extraction of the equivalent circuit of the load 74 and output network 82. The extracted equivalent circuit is then used to define the negative-component equivalent circuit in the NCSP. Thus a substantially flat frequency response is maintained even under conditions when the load is unknown and variable.

The fifth structural embodiment of the invention (FIG. 15) uses multiple minimum-rating filters to combine the outputs of multiple amplifiers into the same load. Two or more input signals are produced by independent sources 241 and 242 and amplified separately by amplifiers 243 and 244. The outputs of amplifiers 243 and 244 are coupled to minimum-rating filters 245 and 246, and the outputs of the filters are coupled to common load 248 with common system output 247. The individual amplifiers operate in bands corresponding to their output filters and can thereby operate over a maximum bandwidth with minimum ratings.

In the sixth structural embodiment of the invention shown in FIG. 16, an NCSP 91 provides driving signals for two or more amplifiers 92 and 93. The outputs from the amplifiers are coupled to a common load 74 through combining network 95. The part 91A of the NCSP that preprocesses the input to amplifier 92 corresponds to the elements of output subnetwork 95A, the reactive elements 74B in load 74, and loading effects of output subnetwork 95B. Part 91B of the NCSP similarly corresponds to the elements of output subnetwork 95B, the reactive elements 74B in load 74, and loading effects of output subnetwork 95A.

The output filters can be of the minimum-rating type. When two PAs are to be combined, the output subnetworks are preferably complementary low- and high-pass filters. Because the NCSP provides driving signals with the proper amplitudes and phases, power is delivered to the load efficiently, system gain from input source 71 to output 75 on load resistance 74A is flat, and the power amplifiers are presented with resistive loads. If subnetworks 95A and 95B are of the minimum-rating type, the ratings of the PAs 92 and 93 are minimized for a given output power.

FIG. 17 shows one variation of the sixth embodiment for multiplexing three or more amplifiers. NCSP 101 provides three preprocessed driving signals to amplifiers 92, 93, and 94 which operate primarily in the frequency bands $f_1$–$f_2$, $f_2$–$f_3$, and $f_3$–$f_4$, respectively, where $f_1 < f_2 < f_3 < f_4$. Output network 105 comprises three subnetworks 105A, 105B, and 105C whose passbands correspond to the primary operating bands of the amplifiers. The outputs of subnetworks 105A, 105B, and 105C are coupled together to form system output 106, which is coupled to load 74.

For operation at frequencies below $f_3$, the drive to amplifier 94 is negligible and the loading of the system output 106 by subnetwork 105C is also negligible (e.g., the impedance of 105C is much higher than the load impedance 74). Consequently, amplifiers 92 and 93 and subnetworks 105A and 105B operate analogously to amplifiers 92 and 93 and subnetworks 95A and 95B in FIG. 16. For operation at frequencies above $f_2$, the drive to amplifier 92 is negligible and the loading of the system output 106 by subnetwork 105A is also negligible. Consequently, amplifiers 92 and 93 and subnetworks 105A and 105B operate analogously to amplifiers 92 and 93 and subnetworks 95A and 95B in FIG. 16.

A second variation on the sixth embodiment for multiplexing three or more amplifiers is shown in FIG. 18. NCSP 101 again provides three preprocessed driving signals to amplifiers 92, 93, and 94 which operate primarily in the frequency bands $f_1$–$f_2$, $f_2$–$f_3$, and $f_3$–$f_4$, respectively, where $f_1<f_2<f_3<f_4$. Output network 107 comprises four subnetworks 107A, 107B, 107C and 107D. The passbands of subnetworks 107A and 107B are $f_1$–$f_2$ and $f_2$–$f_3$, while the passbands of subnetworks 107C and 107D are $f_1$–$f_3$ and $f_3$–$f_4$. At frequencies below $f_3$, amplifiers 92 and 93 with subnetworks 107A and 107B function analogously to the system in FIG. 16. For operation over the whole band, the subsystem comprising amplifiers 92 and 93 and subnetworks 107A, 107B, and 107C is analogous to the combination of amplifier 92 and subnetwork 95A in FIG. 16. The subsystem comprising amplifier 94 and subnetwork 107D is analogous to amplifier 93 and subnetwork 95B in FIG. 16.

It will be apparent to those skilled in the art that various features of these particular embodiments can be combined to form additional embodiments. For example, the three-amplifier topologies shown in FIG. 17 and FIG. 18 are readily extended to include more than three amplifiers. The output networks for low and high bands can be coupled either in parallel as shown, or in series using transformers. The amplifiers can be of any suitable type for the frequency range and power level. Kahn or other high-efficiency amplification techniques can be used in any of the embodiments. The NCSP can be combined with other signal processing techniques suitable for the application. The diplexing and multiplexing embodiment can include load adaptation as shown in FIG. 14.

BRIEF DESCRIPTION OF THE DRAWINGS

The novel features believed characteristic of the invention are set forth in the appended claims. The invention itself however, as well as a preferred mode of use and further objects and advantages thereof, will best be understood by reference to the following detailed description of an illustrative embodiment when read in conjunction with the accompanying drawings, wherein:

FIG. 20A and FIG. 20B show two- and three-section band-pass filters that present high impedances to out-of-band signals. FIG. 20C shows a three-section band-pass filter that presents low impedances to out-of-band signals. FIG. 20D adds a transformer to the three-section band-pass filter, thereby further extending the bandwidth. FIG. 20E is a T filter that can be used for either matching or low-pass applications. FIG. 20F is a three-section band-pass filter implemented with transmission lines.

NOMENCLATURE AND DEFINITIONS

Figure 1:
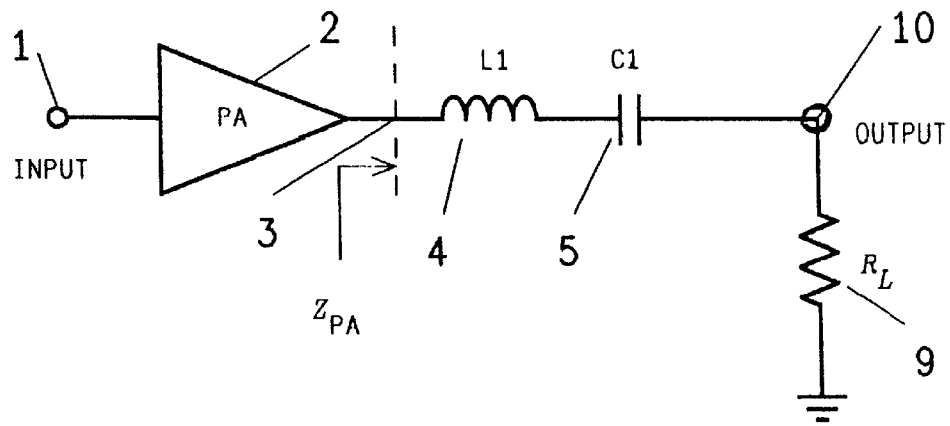
FIG. 1 depicts a power amplifier driving a load through a series-tuned output filter that limits its operating bandwidth.
Figure 2:
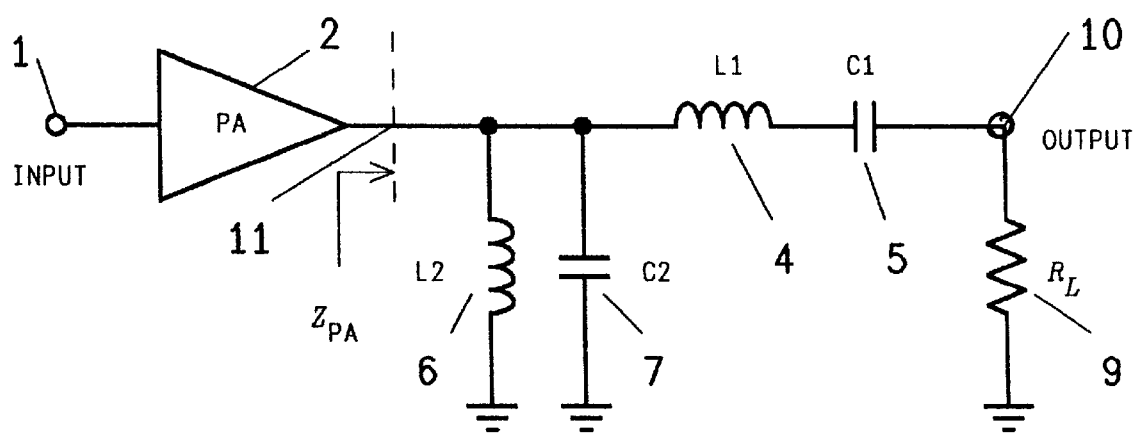
FIG. 2 shows the addition of a parallel-tuned circuit to the circuit of FIG. 1 to increase the bandwidth.
Figure 3:
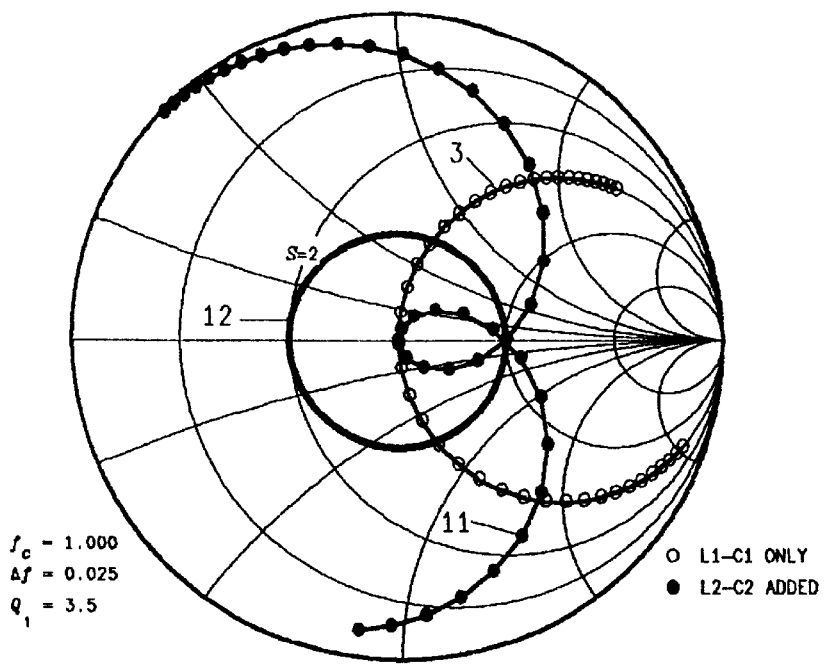
FIG. 3 plots the PA load-impedance loci for the circuit of FIG A. and the modified circuit of FIG. 2.
Figure 4:
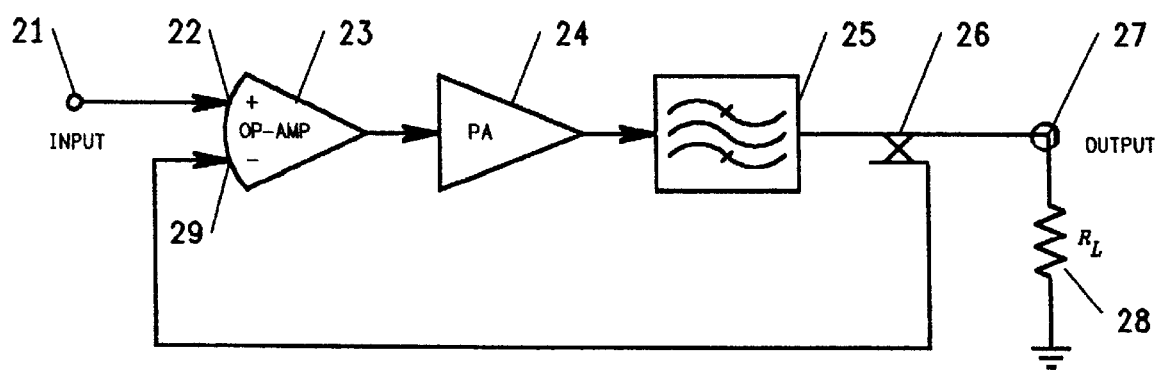
FIG. 4 illustrates the use of feedback to flatten the gain of an amplifier system.
Figure 5:
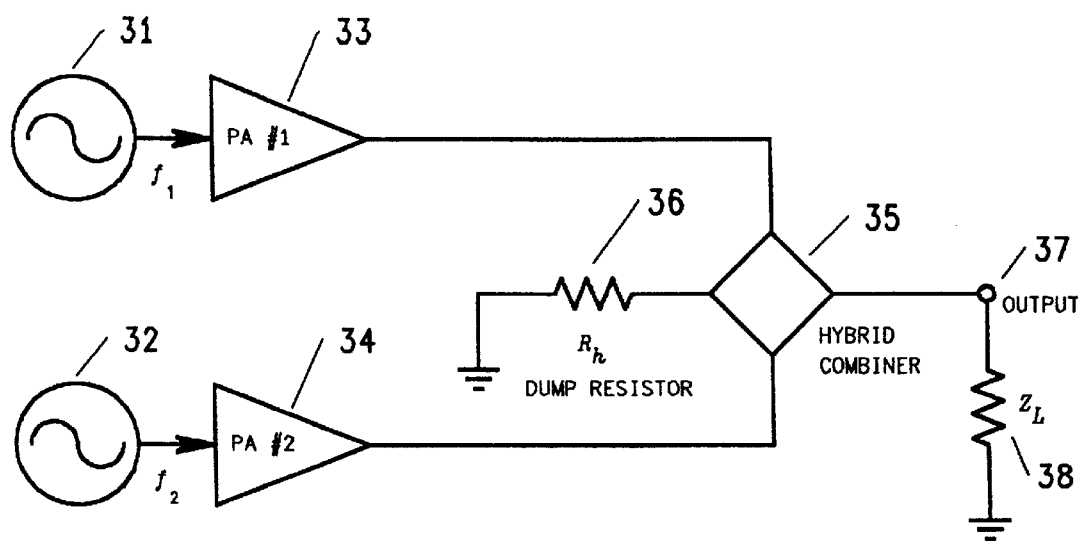
FIG. 5 illustrates combining the outputs of two PAs through a hybrid transformer.
Figure 6:
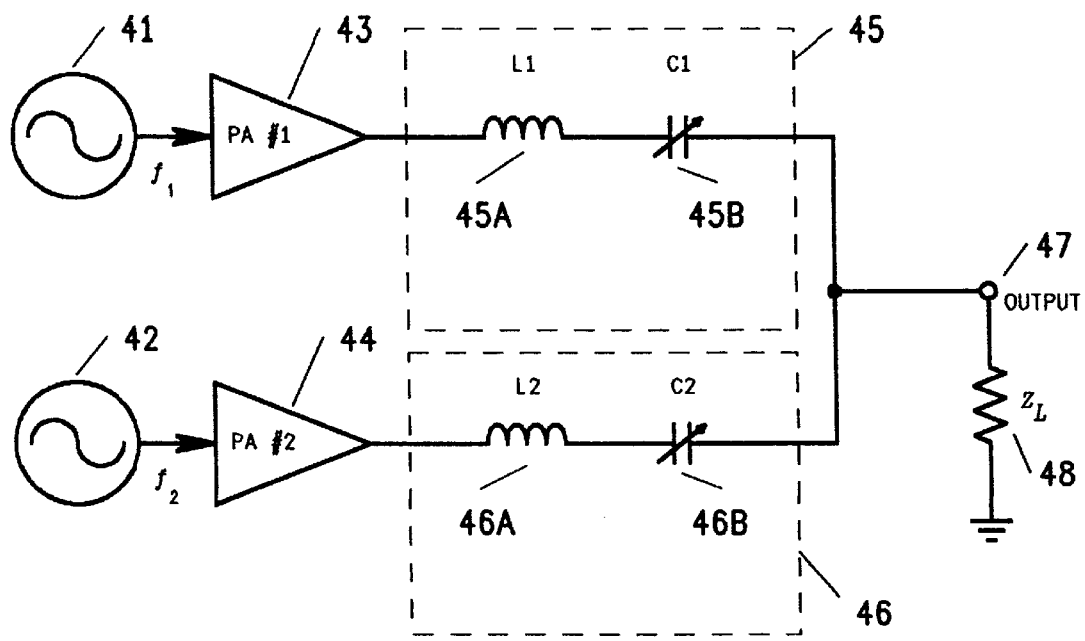
FIG. 6 illustrates the use of a channelized combiner for two PAs.

The term "network" as used herein refers to an electronic circuit comprising components such as inductors, capacitors, resistors, transformers, transmission lines, and the like.

A "filter" is a network used to pass some frequency components and to reject others. A "matching network" is a network used to transform impedance. A "broadbanding network" is a network used to extend the bandwidth over which signal power can be delivered to a load. An "output network" is a network that couples the output of one or more amplifiers to a load.

A "flat frequency response" means that the gain from specified input to specified output is substantially constant and the phase varies substantially linearly with frequency so that the delay is substantially constant at all frequencies.

A "signal" comprises one or more discrete-frequency components or a continuous spectrum contained within a frequency band.

A "signal waveform" is the temporal waveform of the signal itself. A "modulation waveform" is the envelope (amplitude), phase, I component, Q component, or other parameter of the signal waveform.

A "signal source" is any device or combination of devices capable of producing the signal. This includes signal synthesizers, signal generators, D/A converters, analog signal processors, and digital signal processors.

A "minimum-rating filter" is a filter having an input and output and comprising at least one inductor or capacitor. The components are chosen to minimize the maximum input voltage and maximum input current that occur when delivering a given amount of signal power to the load (output) for any signal frequency within a specified operating band. Equivalently, the components of a minimum-rating filter are chosen to allow the maximum operating bandwidth for delivery of a given amount of signal power to the load of the filter with the maximum input voltage and current no larger than specified values. Since the maximum input voltage and maximum input current determine the voltage and current ratings, respectively, of the amplifier that drives the filter, the filter is called a "minimum-rating" (MR) type.

A "minimum-rating network" is a network having an input and output and comprising at least one inductor or capacitor. The components are chosen to minimize the maximum input voltage and maximum input current that occur when delivering a given amount of signal power to the load (output) for any signal frequency within a specified operating band. Equivalently, the components of a minimum-rating network are chosen to allow the maximum operating bandwidth for delivery of a given amount of signal power to the load (output) of the network with the maximum input voltage and current no larger than specified values. Since the maximum input voltage and maximum input current to the network determine the voltage and current ratings, respectively, of the amplifier that drives the network, the network is called a "minimum-rating" (MR) type.

"Rating bandwidth" is the band of frequencies over which a specified amount of signal power can be delivered to the load without exceeding specified input voltage and current ratings.

"Negative-component signal processing" is signal processing that simulates the actions of an electronic filter or network comprising one or more negative components (i.e., negative inductor, negative capacitor, or negative resistor). Negative-component signal processing is used to provide signals whose amplitude and phase vary in ways opposite to the variations produced by physical circuits such as filters, matching networks, and combiners.

A "Negative-component signal processor" (NCSP) is a signal-processing device or system that performs negative-component signal processing. An NCSP is used to provide signals whose amplitude and phase vary in ways opposite to the variations produced by physical circuits such as filters, matching networks, and combiners. Implementation of an NCSP may be based upon signal synthesizer with memory, active circuits such as operational amplifiers, a digital signal processor, a general-purpose circuit simulator, or other suitable technology.

A "digital signal processor" is a circuit or combination of circuits that performs signal processing through digital techniques. As used herein, the "digital signal processor" includes analog-to-digital converters, digital-to-analog converters, memory, and other components as are required to produce the desired functionality.

A "diplexer" is a system for combining the signals from two different sources (e.g., amplifiers) into a single load (e.g., antenna). A "multiplexer" is a system for combining the signals from two or more different sources into a single load.

A "load sensor" is any device (e.g., directional coupler, SWR bridge, voltage probe, current probe) capable of measuring the characteristics (e.g., SWR, impedance) of the load. As used herein, the "load sensor" includes supporting apparatus such as analog-to-digital converters, rectifiers, filters, and other components required to produce the desired functionality.

BEST MODE FOR CARRYING OUT THE INVENTION

The invention is based upon minimum-rating filters and matching networks and negative-component signal processing. They can be used together or separately, and with one amplifier or multiple combinations of amplifiers.

Minimum-Rating Filters and Matching Networks

The minimum-rating (MR) filter overcomes the limitations of prior-art broadband filters by minimizing peak voltage and current at its input over the maximum bandwidth. This results in minimizing the required transistor ratings for delivery of a specified amount of power, or equivalently allowing safe delivery of the maximum amount of power.

To explain the principles of the MR filter, it is convenient to define a power-rating factor $\gamma$ as the ratio of two power ratings. The numerator is the power rating required for delivery of a given amount of power to a load impedance z and the demonimator is the power rating for delivery of the same amount of power to the nominal (resistive) load $R_0$. The power ratings are in turn the products of the voltage and current ratings. Like SWR, the rating factor is a measure of the suitability of the load for delivery of power.

Delivery of full sine-wave power $P_{oF}$ to nominal load $R_0$ requires the PA to deliver output voltage and current $V_{omF}$ and $I_{omF}$, which are related by $$P_{oF} = \frac{1}{2} I_{omF} V_{omF} = \frac{1}{2} I_{omF}^2 R_0 = \frac{1}{2} \frac{V_{omF}^2}{R_0}. \quad (1)$$

The peak drain or collector voltage and current (i.e., transistor ratings) are directly proportional to $V_{omF}$ and $I_{omF}$, respectively.

For higher-than-nominal impedances, delivery of power is generally limited by the voltage rating of the transistors. Delivery of full power to a load with $|Z|>R_0$ requires that $$V_{om}^2 = \frac{R_p}{R_0} V_{omF}^2 = \Upsilon V_{omF}^2. \quad (2)$$

where $R_p$ is the parallel-resistance component of the load admittance and $V_{om}$ is the required voltage.

For lower-than-nominal impedances, delivery of power is generally limited by the current rating of the transistors. Delivery of full power to a load with $|Z|<R_0$ requires that $$I_{om}^2 = \frac{R_0}{R_s} I_{omF}^2 = \Upsilon I_{omF}^2. \quad (3)$$

The rating factor is therefore related to the load impedance by the simple formula $$\Upsilon = \begin{bmatrix} R_p/R_0, |Z| > R_0 \\ R_0/R_s, |Z| \leq R_0. \end{bmatrix} \quad (4)$$

Constant-rating contours (FIG. 19) follow the series-resistance lines on the left side of the Smith chart and the parallel-resistance lines on the right. As a result, they are football-shaped and enclose the constant-SWR contours of the same value.

Both the voltage rating and the current rating must increase by a factor of $\gamma^{0.5}$ to deliver full power to any impedance within the $\gamma$ contour. The power rating of the transistors must therefore increase by a factor of $\gamma$. While it is convenient to extend both voltage and current ratings by the same factor, it is not necessary.

Several examples of the multitude of possible topologies for minimum-rating filters are shown in FIG. 20A–FIG. 20F. Filters 121 and 122 are two- and three-section band-pass filters with high out-of-band impedance, implemented from lumped elements (discrete components). Filter 123 is the dual of filter 122 and has a low out-of-band impedance. A transformer can be added on either end as in 124 to shift the impedance locus (left or right on the Smith chart) and thereby increase bandwidth. Filter 125 is the low-pass analog of 122. Filter 126 is the microwave analog of 122 implemented with transmission lines. An analogous arrangement can be used with waveguide filters. The elements in an MR network can be fixed for use with a fixed, known load or variable to allow tuning or adaptation to a different frequency or a different, unknown, or variable load. Minimum-rating band-pass filters can also be used for diplexing and multiplexing given small separations in their passbands.

Figure 21:
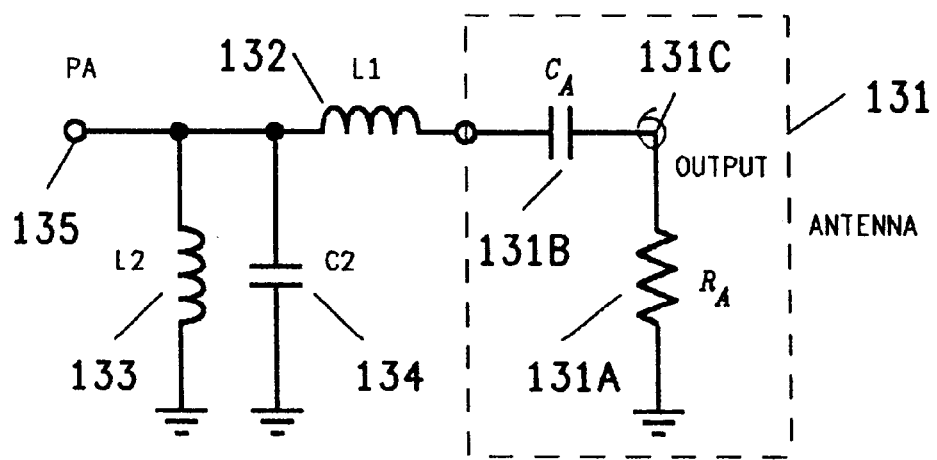
FIG. 21 shows an example of an MR matching network for an antenna.

An example of the multitude of possible minimum-rating matching networks is shown in FIG. 21. The equivalent circuit of antenna 131 is a series combination of resistance 131A and capacitance 131B. Inductor 132 cancels the reactance due to antenna capacitance 131A. The high Q of resonate circuit formed by inductor 132 and antenna capacitance 131A limits the bandwidth over which power can be delivered to the antenna. Inductor 133 and capacitor 134 are chosen to extend the bandwidth or to minimize the required ratings. Matching networks that transform the load impedance as well as extend the bandwidth can be designed based upon similar principles.

Figure 22:
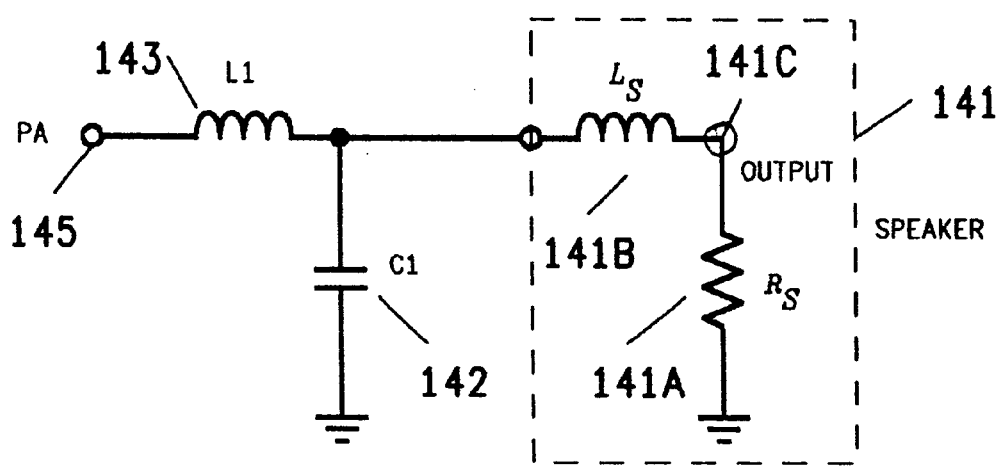
FIG. 22 shows an example of an MR matching network for a loudspeaker.

Another example is shown in FIG. 22. Speaker 141 is electrically equivalent to resistance 141A in series with inductance 141B. The increasing reactance due to inductance 141B makes it progressively more difficult to drive signals into the speaker as frequency increases. Capacitor 142 and inductor 143 are chosen to maximize the bandwidth or minimize the required amplifier ratings.

The distinguishing feature of a minimum-rating network is not the topology, but the use of component values for maximum bandwidth within a given rating constraint or for minimum ratings within a bandwidth constraint. Also included in the design process, of course, can be other desired features such as a minimum impedance at the harmonic frequencies and/or a minimum attenuation of the harmonics. The component values can be found by analytical formulas in some cases and by numerical optimization in others.

Figure 23:
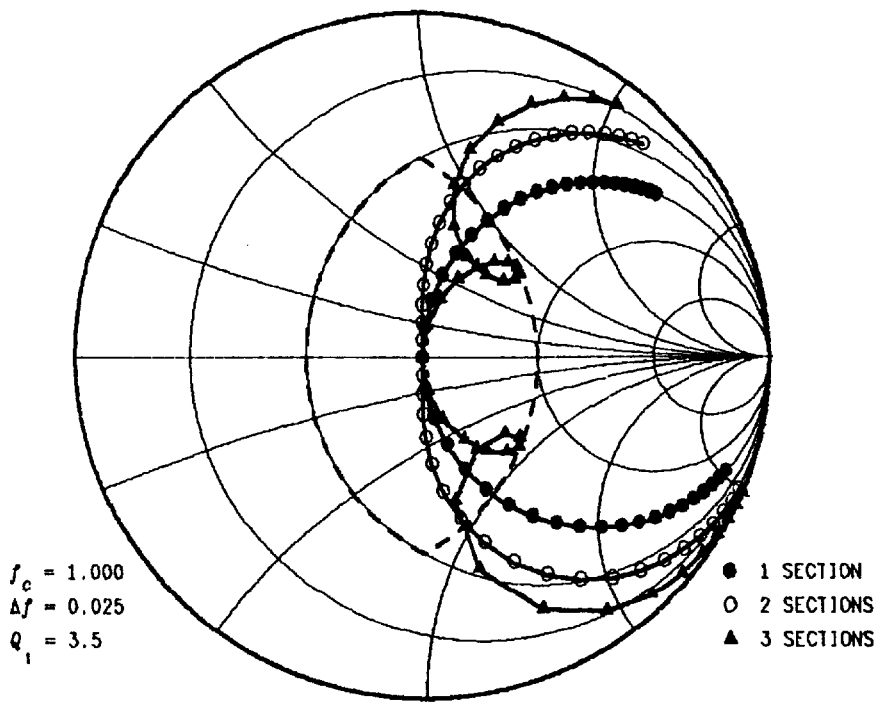
FIG. 23 illustrates how the MR filter increases the bandwidth over which satisfactory ratings are obtained by containing more of the input-impedance loci within the rating contour.
Figure 24:
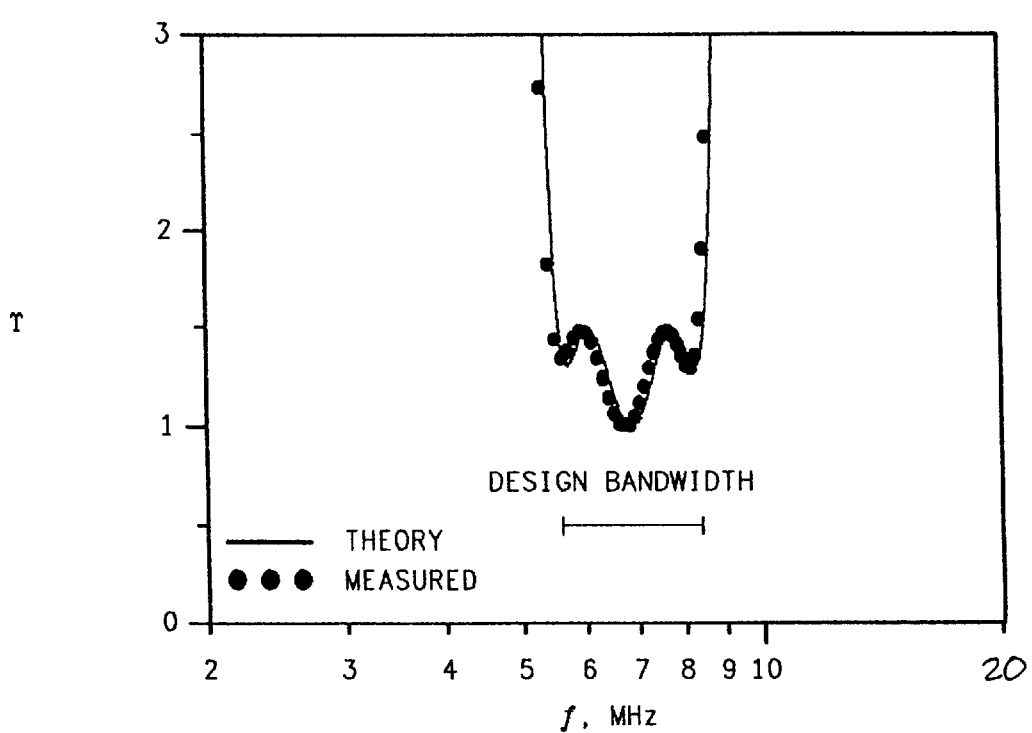
FIG. 24. shows predicted and measured rating factor across the band for a three-section MR bandpass filter.

FIG. 23 presents impedance loci for two- and three-section MR band-pass filters (circuits 121 and 122 in FIG. 20A and FIG. 20B) designed for a rating factor of no more than 2 in the passband. The passband ratio (highest passband frequency divided by lowest passband frequency) is increased from 1.223 for the single-section filter to 1.494 for the two-section filter and 1.632 for the three-section filter. These represent roughly doubling and tripling the bandwidth over which satisfactory ratings are obtained. FIG. 24 shows predicted and measured results for a similar filter designed for $\gamma \leq 1.5$.

A minimum-rating network can be designed by the following procedure. First, a network topology consistent with the function of the network (e.g., (low-pass filter, band-pass filter, matching, broadbanding) is selected. In band-pass applications with highly reactive loads, the element nearest the load is preferably selected to cancel load reactance at the center frequency. If the amplifier requires a low or high out-of-band impedance, further selection of the topology is required. For example, series inductors or series-tuned circuits produce high out-of-band impedances, while shunt capacitors or parallel-tuned circuits produce low out-of-band impedances. The value of the end element can be chosen to produce the impedance required at a specific frequency. The number of sections (poles) is selected to produce the required attenuation to specified frequencies, based upon the approximate cut-off frequency and the frequency at which the attenuation is required. In broadband applications, the topology is determined by using alternating elements of "opposite" type. For example, if the load has a series-tuned characteristic, the adjacent element of the network is preferably a parallel-tuned type, followed by a series-tuned type, and so forth. After the topology is selected, the values of components must be determined, as discussed below. In some cases, the approximations used in this procedure necessitate a second iteration to achieve the design goals.

Figure 19:
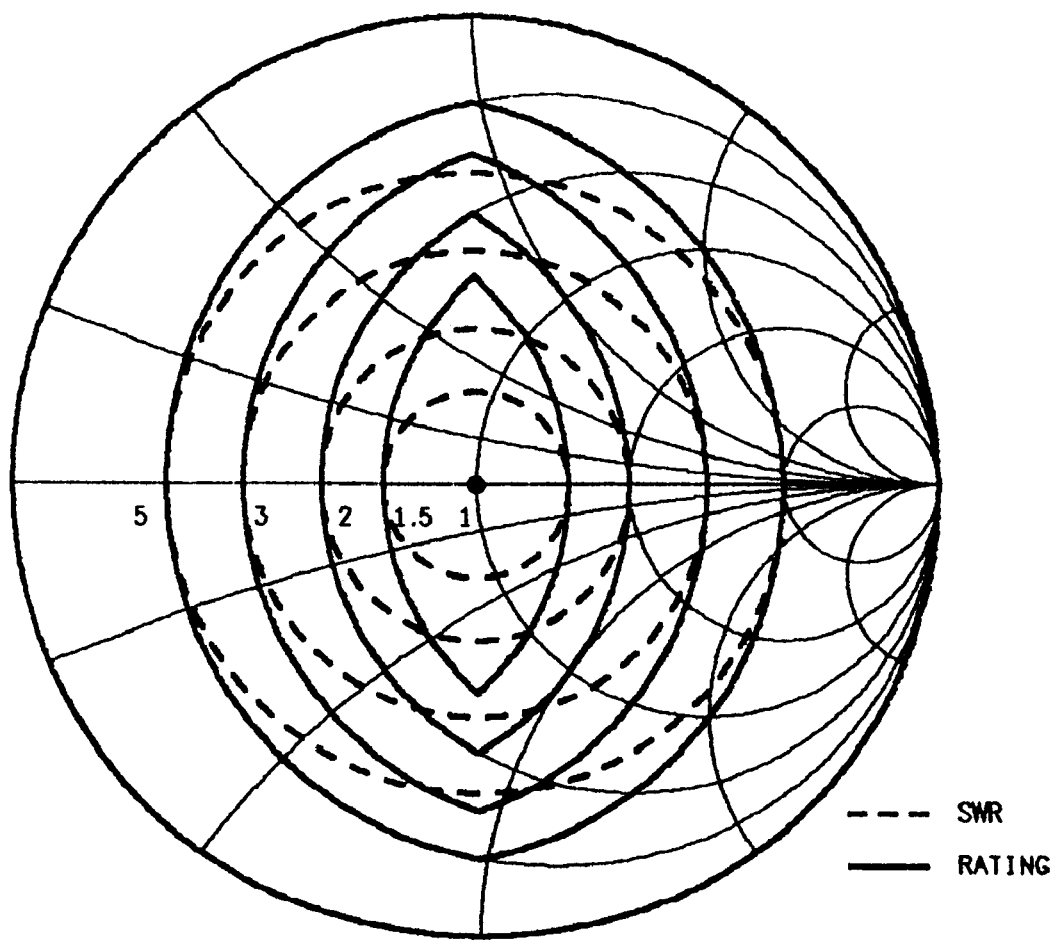
FIG. 19 shows rating and SWR contours on a Smith chart.
Figure 20A:
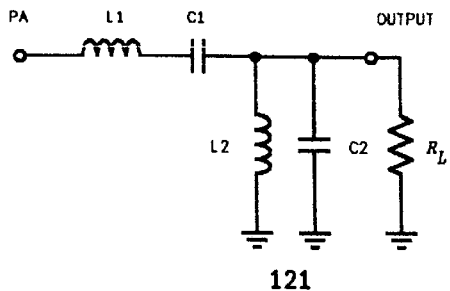
FIG. 20A through FIG. 20F give examples of MR filter networks.
Figure 20B:
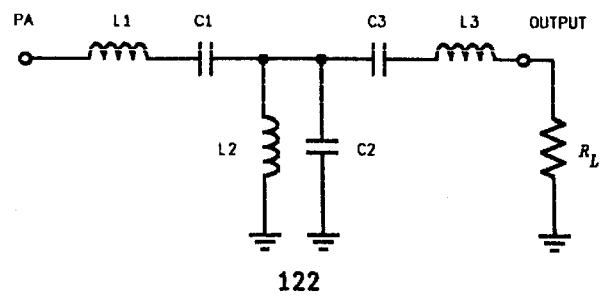
Figure 20C:
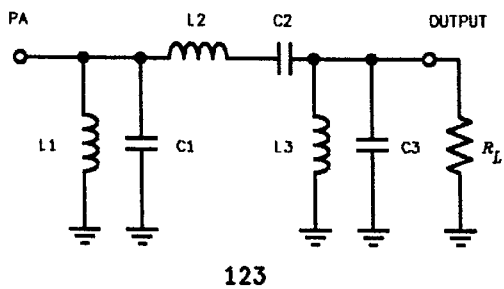
Figure 20D:
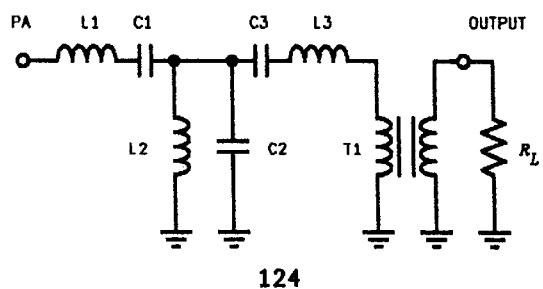
Figure 20E:
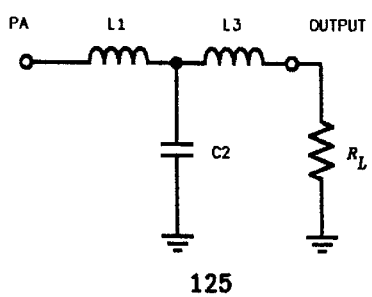
Figure 20F:
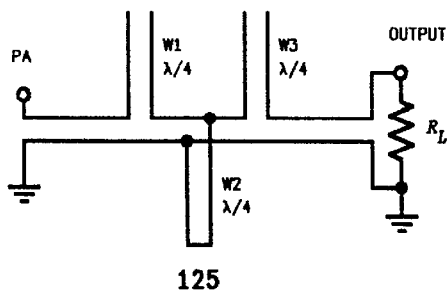

The values of the components of an MR filter are most readily determined through numerical techniques, although graphical and analytical methods can be used in some relatively simple cases. While a standard table of low-pass components for the MR-filter characteristic can be developed, other applications such as matching to reactive loads require unique adaptations. An MR filter can be designed for voltage and current ratings that are larger than the nominal-load voltage and current by the same factor (symmetric contours as shown in FIG. 19), or for different rating factors for voltage and current (which produces asymmetric contours). An MR filter can also be optimized for specific nonsinusoidal signals.

For general matching, broadbanding, low-pass, and high-pass networks, it is most convenient to vary the values of the components themselves. In band-pass and band-stop filters, the values of each pair of components (inductor and capacitor) are defined by the Q of the pair. The Q of a series-tuned circuit (i.e., L1 and C1 in 122 of FIG. 20B) is defined as the ratio of the reactance of one element to the load resistance at the center of the band of operation. The Q of a parallel-tuned circuit (e.g., L2 and C2 in 122 of FIG. 20B) is similarly defined as the ratio of the susceptance of one of the elements to the load conductance at the center of the band. In such cases, it is advantageous to vary the Qs of the various resonator pairs, thereby reducing the number of independent variables by a factor of two. Transformer ratios, transmission-line lengths, transmission-line impedance, and other parameters can be included in the design process as suits the components to be used in the network.

To visualize the design process, it is instructive to refer to the example plot of impedances in Smith-chart format (FIG. 22) and the example plot of rating factor as a function of frequency (FIG. 24). In some cases (e.g., 2-section band-pass filter), the impedance locus exits from rating contour at the edge of the band and maximum bandwidth is obtained by expanding the band edges as much as possible. In other cases (e.g., 3-section band-pass filter), the maximum bandwidth is obtained when the specified rating factor is reached simultaneously at (a) the band edges and (b) frequencies interior to the band of operation.

Depending upon the design goal, the numerical algorithm can monitor (a) a common rating factor, (b) separate rating factors for voltage and current, or (c) bandwidth for a given rating factor or factors. In some applications, gain and impedance must also be monitored. For example, a filter for a power amplifier may be required to produce a minimum attenuation and minimum impedance at the harmonic frequencies, which are in turn related to the lowest frequency in the passband of the network.

Components for the less-complex cases such as the two-section band-pass filter can be determined through gradient-search techniques. Initial values for the components are found by a grid or random search. Gradients (derivatives of rating factor with respect to component values) are then used to move the solution iteratively to the set of values that gives the maximum bandwidth or minimum rating.

Figure 25:
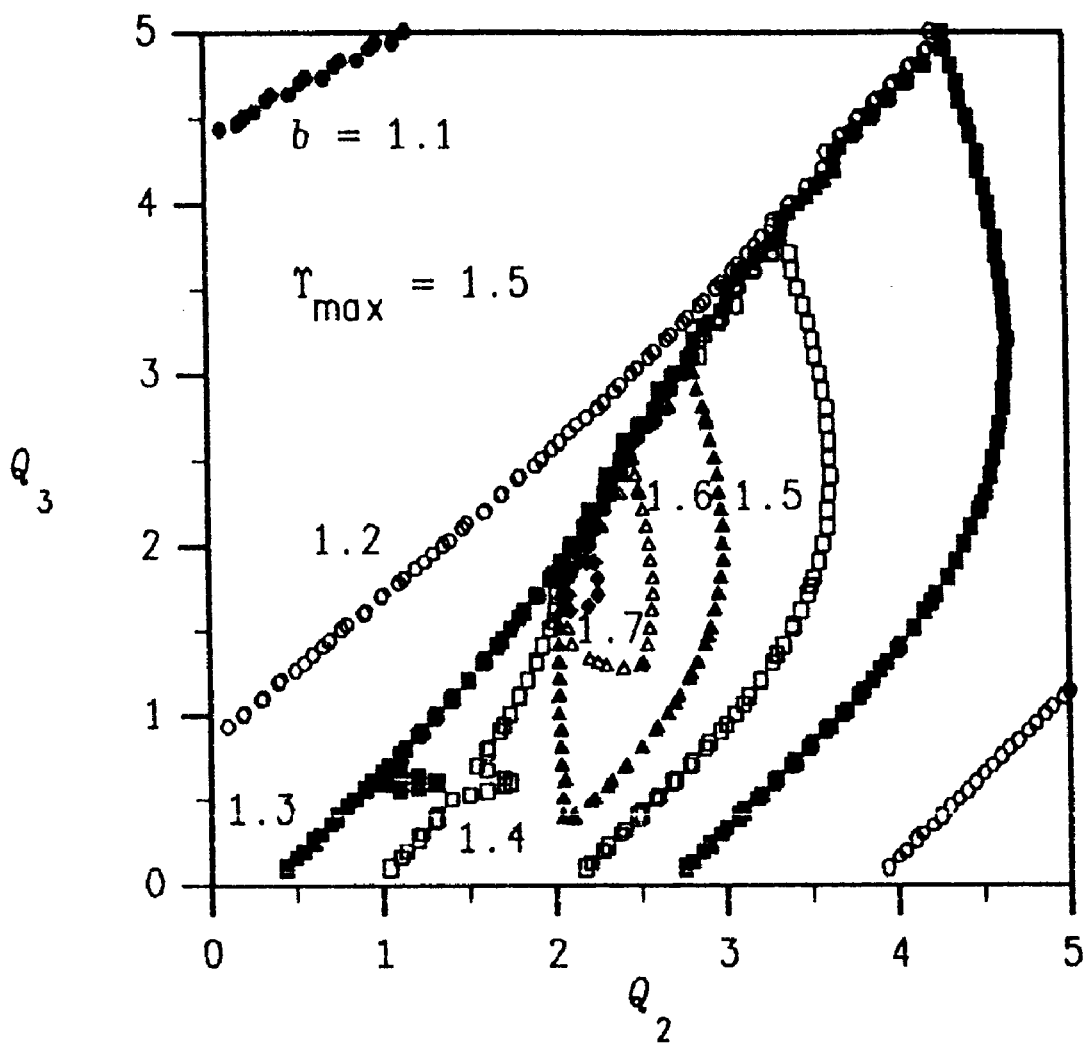
FIG. 25 is an example of how bandwidth contours are used to select the values of components for an MR filter.

Repeated multi-axis grid search is generally most advantageous for the more complex cases such as the three-axis band-pass filter. Small changes in component values can push an interior point outside the rating contour, causing abrupt changes in the maximum rating factor or its derivatives, an example of which can be seen in FIG. 25. Because the discontinuous derivatives cause significant problems for gradient-search algorithms, it is advantageous to use repeated grid search with progressively smaller step sizes. Such an algorithm is generally capable of finding within three of four iterations component values with accuracies comparable to those with which components can be selected. In some cases, it may be necessary to optimize at more than one local maximum to identify the globally optimum solution.

For relatively simple networks, it is possible to derive analytic formulas for the rating factor as a function of frequency and component values. When the maximum rating occurs only at the band edges (e.g., 2-section filter in FIG. 22), it is sufficient to solve the equation for frequency as a function of rating and then to solve for the component values that correspond to the edge frequency. If interior maxima in the rating factor occur (e.g., 3-section filter in FIG. 22 and FIG. 24), analytic derivations are more complicated. First, the derivatives of rating factor as functions of component values must be determined. These are set to zero and the resultant system of equations is then solved for component values.

TAB. 1 presents achievable values of the passband ratio b (ratio of highest frequency to lowest frequency) with satisfactory rating factor) for various values of $Q_1$ (of L1 and C1 in circuit 122 of FIG. 20B) and $\gamma$. TAB. 2 gives ratios $Q_3/Q_1$ and $Q_2/Q_1$ that can be used to design two- and three-section MR band-pass filters.

TABLE 1

Maximum pass-band ratios for MR band-pass filters.

| N | $Q_1$ | $\gamma_{max} = 1.5$ | b<br>2 | 3 |
|---|---|---|---|---|
| 1 | 2 | 1.422 | 1.640 | 2.000 |
|   | 3 | 1.265 | 1.393 | 1.595 |
|   | 4 | 1.193 | 1.283 | 1.422 |
|   | 5 | 1.152 | 1.221 | 1.326 |
| 2 | 2 | 1.821 | 2.000 | 2.319 |
|   | 3 | 1.496 | 1.595 | 1.768 |
|   | 4 | 1.354 | 1.421 | 1.537 |
|   | 5 | 1.275 | 1.326 | 1.412 |
| 3 | 2 | 2.310 | 2.794 | 3.769 |
|   | 3 | 1.763 | 2.016 | 2.505 |
|   | 4 | 1.534 | 1.700 | 2.011 |
|   | 5 | 1.409 | 1.531 | 1.756 |

TABLE 2

Optimum Q ratios for two- and three-section MR band-pass filters.

| | N = 2 | N = 3 | |
|---|---|---|---|
| $\gamma_{max}$ | $Q_2/Q_1$ | $Q_2/Q_1$ | $Q_3/Q_1$ |
| 1.5 | 0.5810 | 0.6948 | 0.609 |
| 2.0 | 0.5000 | 0.5164 | 0.620 |
| 3.0 | 0.3330 | 0.3350 | 0.549 |
| 4.0 | 0.2500 | 0.2500 | 0.500 |

The method for calculating network components can be implemented in a control system for automatic tuning and readjustment of the network, thus allowing the MR network to operate with unknown or changing loads. Basically, such a system adds a load-sensing device between the amplifier and output network or between the output network and load. The load-sensing device can be an SWR bridge, directional coupler, voltage and current sensor, or any other suitable device. A microprocessor or other suitable control system uses the measured load characteristics or network input voltages and the known filter topology during execution of the design procedure as outlined above. Alternatively, component values for various load conditions can be pre-calculated and stored in memory. In either case, the microprocessor changes the values of the network components through relays, pin-diode switches, motors, or the like so that the network maintains a minimum-rating characteristic for unknown and changing load conditions.

Negative-Component Signal Processing

Negative-component signal processing (NCSP) flattens the frequency response of an amplifier system by adjusting the gain(s) and phase(s) of the driving signals(s) to counter the effects of the output filter or matching network and load. This is accomplished without feedback or feedforward techniques so that the bandwidth is greatly extended, stability is enhanced, and component tolerances are not required to be unduly precise.

Figure 11:
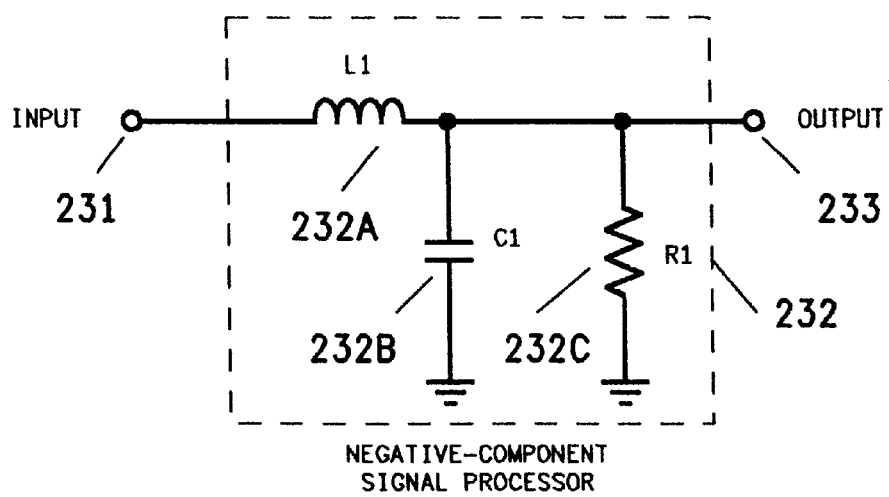
FIG. 11 shows an example of the second structural embodiment of the invention in which active circuits, a DSP, or other techniques are configured to behave as a circuit that contains one or more negative elements.
Figure 12:
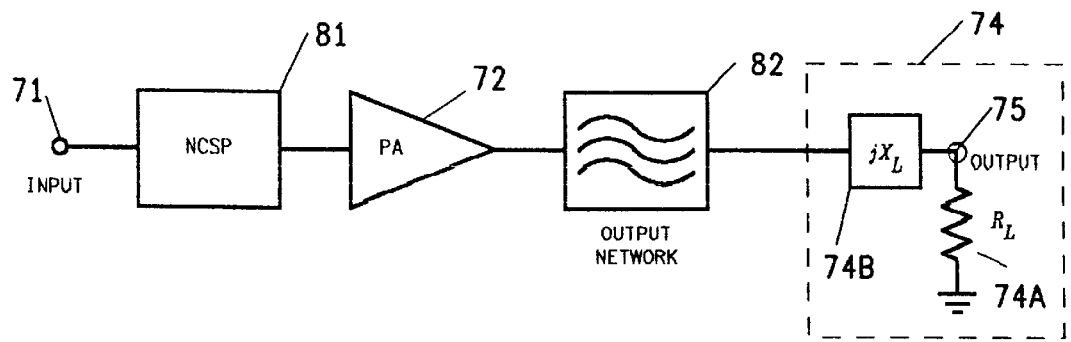
FIG. 12 illustrates the second structural embodiment of the invention in which the drive to an amplifier is preprocessed by a negative-component signal processor to achieve a flat frequency response over the frequency band of operation.
Figure 13:
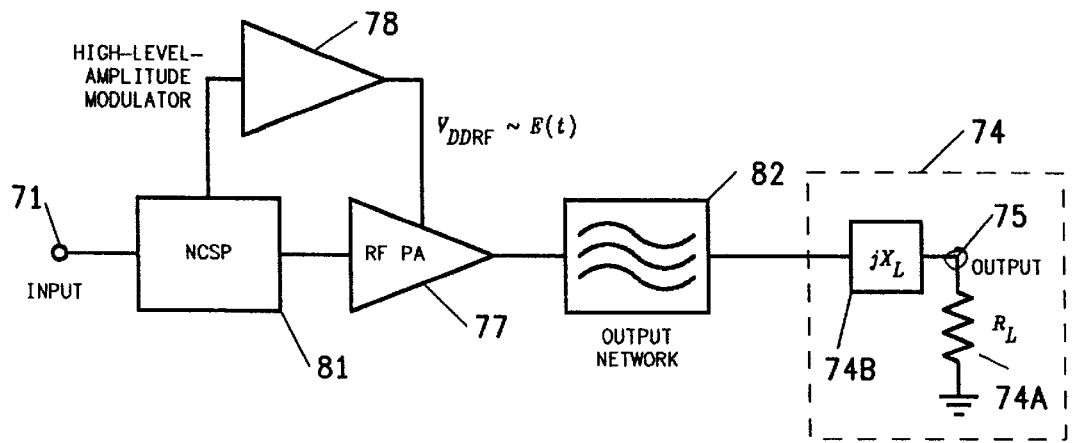
FIG. 13 shows the use of a Kahn-technique amplifier in the second embodiment for high-efficiency amplification.
Figure 14:
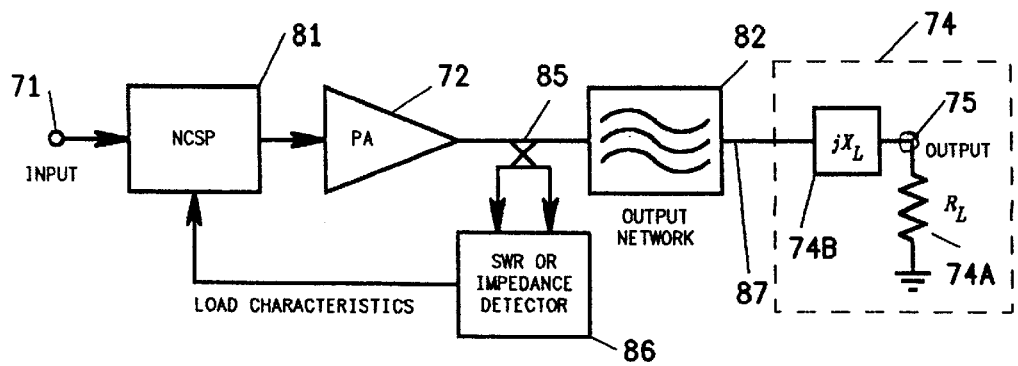
FIG. 14 illustrates the incorporation of load-sensing circuits to allow automatic adjustment and adaptation of the NCSP.

FIG. 11 illustrates one example of an NCSP. This NCSP comprises one inductor, one capacitor, and one resistor. One or more of the components has a negative value.

Figure 26:
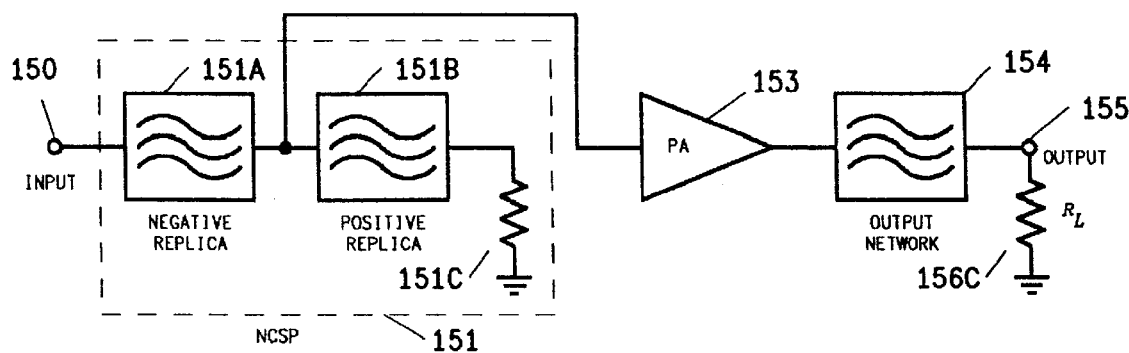
FIG. 26 depicts a generic amplifier system incorporating negative-component signal processing to flatten its gain.

The specific form of an NCSP system depends, of course, upon the characteristics of the output network, the characteristics of the load, the number of amplifiers to be used, and other factors. The block diagram of a generic NCSP system for a single amplifier is shown in FIG. 26. Amplifier 153 delivers its signal to load resistance 156 through network 154, which may include an output filter, matching network, and reactive components of the load. NCSP 151 comprises networks 151A and 151B and load resistance 151C. Network 151B is a replica of output network 154 (and therefore based upon positive inductors and capacitors) and load resistance 151C is a replica of output load resistance 156. Network 151A is a mirror image of network 151B with negative inductors and capacitors. The negative reactive components in network 151A cancel the effects of positive reactive components in network 151B, resulting in a flat frequency response from system input 150 to the replica 151C of the load resistance. The amplitude and phase of the signal at the output 152 of subnetwork 151A and 151B is automatically adjusted to compensate for changes in amplitude and phase introduced by replica subnetwork 151B, hence also for those of the physical output network 154. Signal 152 is therefore used to drive amplifier 153, resulting in a flat frequency response from input 150 to output 155 on load resistance 156.

Figure 27:
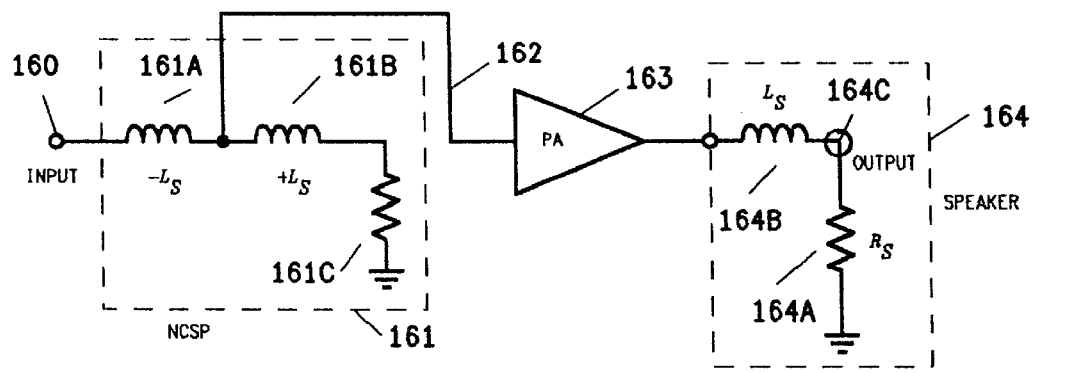
FIG. 27 illustrates the application of NCSP to an audio system in which a power amplifier drives a loudspeaker.
Figure 27:
Figure 27:
Figure 28:
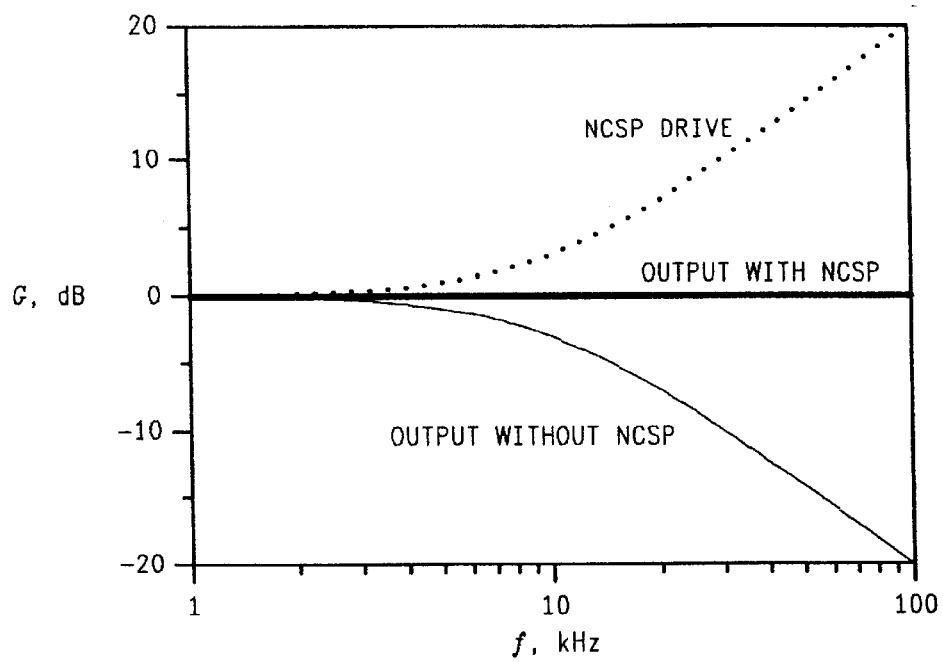
FIG. 28 shows the frequency responses associated with the example audio system.

The application of an NCSP is best understood by the simple example of flattening the response of an audio system (FIG. 27) that includes an audio power amplifier 163 and loudspeaker 164. Amplifier 163 is a class-S power amplifier or other type of PA that acts as a voltage source. In a conventional amplifier system with the input routed directly to the amplifier, the inductance in the speaker acts as a low-pass filter and decreases the high-frequency response, as shown in FIG. 28. The NCSP for this system comprises a replica 161C of speaker resistance 164A, a positive replica 161B of the speaker inductance 164B, and a negative replica 161A of the speaker inductance. As can be seen in FIG. 28, the amplitude of signal 162 increases with frequency to compensate for the decrease due to speaker inductance 164B. Driving amplifier 163 with signal 162 therefore produces a flat frequency response as seen in FIG. 28. This effect can also be seen in the example waveforms in FIG. 27. The example input waveform at 160 is an approximation to a square wave with components at 5 and 15 kHz. In this example, the speaker has a 3-dB cut-off frequency of 10 kHz which causes the 15-kHz component to be attenuated significantly more than the 5-kHz component. The 15-kHz component is accentuated in driving signal 162, resulting in a perfect replica of the input at output 165.

Figure 29:
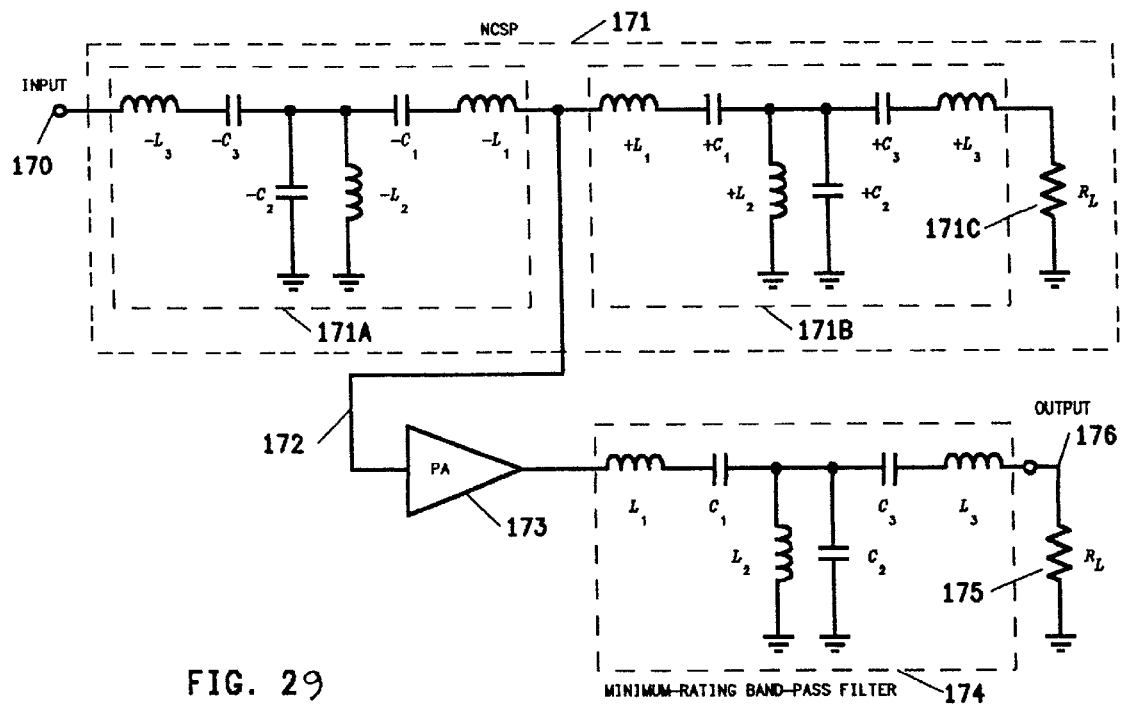
FIG. 29 illustrates the use of both NCSP and minimum-rating output filters.
Figure 30:
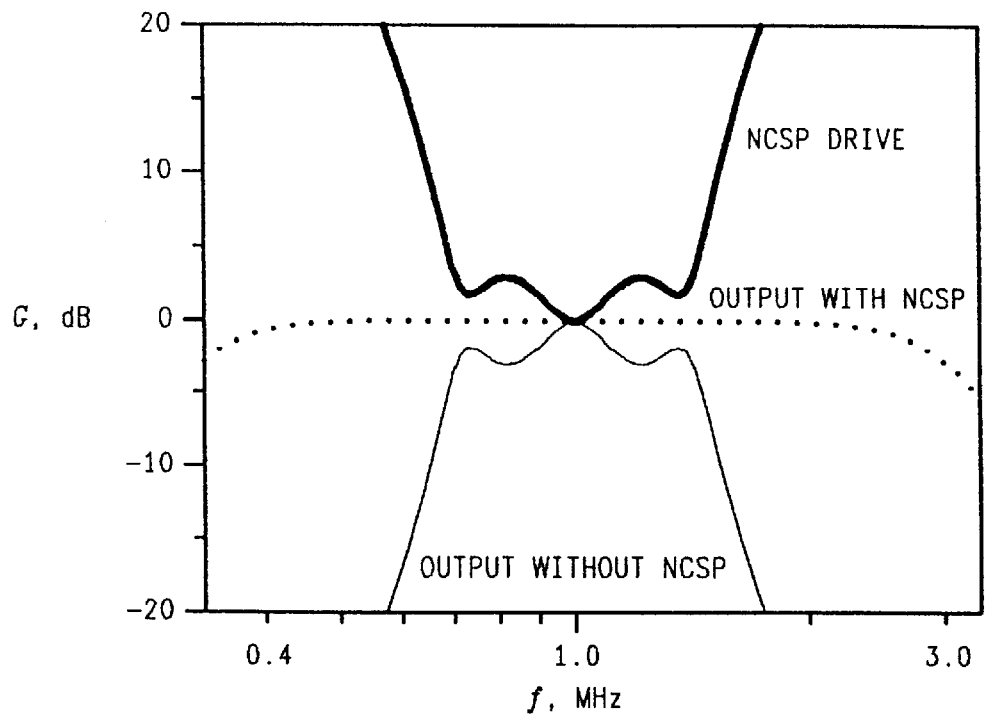
FIG. 30 shows the frequency responses for the example system with MR output filter.

FIG. 29 depicts an amplifier system that comprises both a minimum-rating output filter 174 and an NCSP 171. The MR filter has an inherent gain variation as shown in FIG. 30. NCSP replica network 171B and replica load 171C have the same values as do the physical output network 174 and load 175, and are arranged in the same order. The components in NCSP replica network 171A correspond to those in output network 174, but In reverse order and with negative values. The drive is again taken from the connection between the two NCSP networks, resulting in a flat frequency response of the system. The slight droop in the system frequency response outside of the passband is due to loading of the high-impedance NCSP components by resistors required in the simulation. This system is particularly advantageous as it has both minimum amplifier ratings and a flat frequency response.

Negative inductors and capacitors do not, of course, exist as real, physical components. The NCSP can, however, be implemented by a multitude of techniques including waveform synthesizers or I/Q modulators with look-up tables, active analog circuits, and digital signal processing. Basically, these techniques simulate or calculate the effects of the negative components to produce the required amplitude and phase changes between the NCSP input and output. These techniques are preferably implemented at low signal levels to minimize power consumption.

Figure 31:
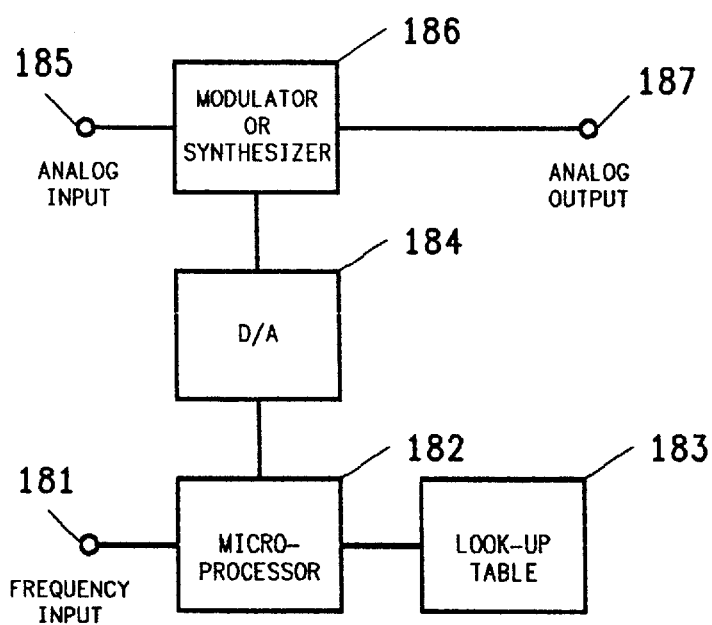
FIG. 31 depicts an embodiment of an NCSP based upon look-up tables.

Synthesis and look-up techniques are based upon calculation of the gain and phase of the NCSP output. Typically, the gain and phase are pre-calculated and stored in a look-up table in ROM, RAM, etc., although they can be calculated as needed. In the embodiment shown in FIG. 31, frequency information 181 is supplied to microprocessor 182, which then obtains gain and phase information from look-up table 183. The gain and phase information are translated by the microprocessor into I and Q amplitudes if necessary and then converted to analog form if necessary by optional D/A converter 184. Digital output from microprocessor 182 or D/A 184 then controls the modulator or synthesizer 186. A synthesizer acts upon the command to generate the desired NCSP-output signal 187 directly. A modulator alters the amplitude and phase of optional analog input signal 185 to produce an NCSP output 187 with the desired amplitude and phase. In many applications, phase is unimportant and need not be included in the synthesizer or modulator.

Figure 32:
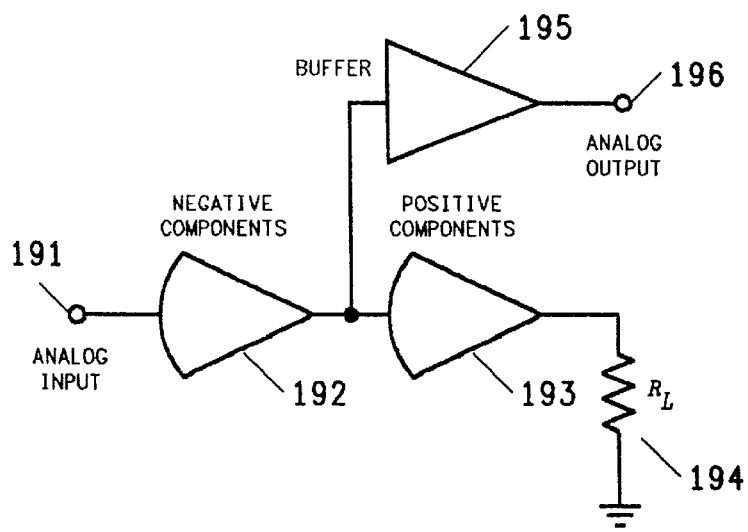
FIG. 32 depicts an embodiment of an NCSP based upon analog integrated circuits.

Analog circuits can approximate the desired gain and phase variations over a limited bandwidth. However, inductors and capacitors of both positive and negative values are readily simulated by active circuits such as operational amplifiers (op-amps). A multitude of techniques may be used. For example, configuration of an op-amp to act as an integrator simulates the charging of a capacitor by input current, while configuration as a differentiator simulates the voltage produced on an inductor by current driven into it. FIG. 32 shows a simplified embodiment of an analog-circuit NCSP for the audio application of FIG. 27. Op-amp 193 simulates the positive inductance of the speaker, while op-amp 192 acts as a negative inductor. Buffer amplifier 195 has a very high input impedance so that it does not load op-amps 192 and 193. Amplifiers 192 and 193 in practice may include multiple op-amps, transistors, and assorted passive components, and are interconnected to simulate the interaction of the two networks in the NCSP.

Figure 33:
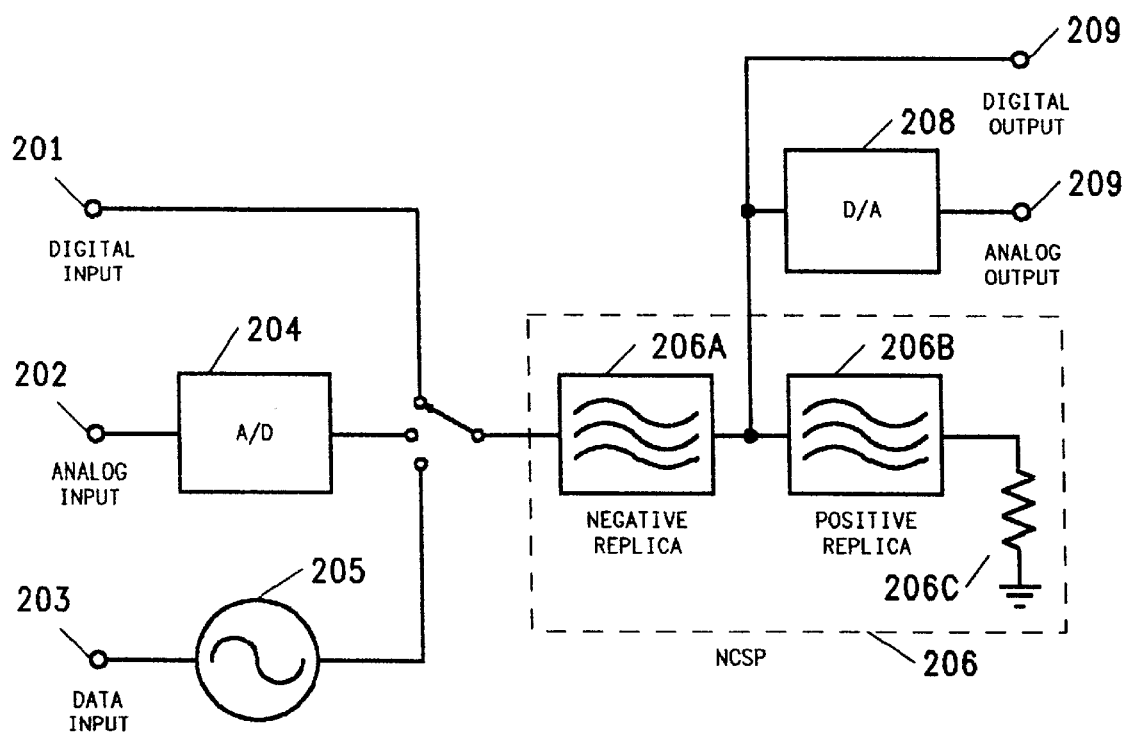
FIG. 33 depicts an embodiment of an NCSP based upon digital signal processing.

A digital signal processor (DSP) uses digital computations to simulate the operation of the networks in the NCSP. The basic functions of a DSP-based embodiment of an NCSP are shown in FIG. 33. A variety of inputs can be used with minor variations in the circuit. An input waveform 201 in digital form is simply passed to processing algorithms 206 directly. An input waveform in analog form 202 must first be converted to digital form by A/D converter 204. If the input is in the form of modulation information (e.g., data bits), a digital representation of the waveform is generated by synthesis algorithm 205. The output of processing algorithm 206 can be output directly in digital form (207) for drive of a signal synthesizer. If analog output 209 is required, the digital output is converted to analog form by D/A converter 208.

Processing algorithm 206 can be based upon a variety of different techniques. For example, an infinite-impulse-response (IIR) filter of suitable topology can simulate the two networks, which in general are not implemented as separate algorithms. An FIR filter can approximate the IIR response of the networks. Simulation techniques such as those used in SPICE can also be used. Alternatively, the input signal can be transformed into frequency components and gain and phase changes applied in the frequency domain, after which it is transformed back to a time-domain representation. Various equivalent topologies based upon well-known circuit theory (e.g., duals) can be used as the networks simulated in the NCSP.

Negative components are implemented by essentially the same techiques as positive components. In most approaches, filter coefficients are simply calculated with negative values of the circuit components. In some approaches (e.g., SPICE), all that is required is changing a sign.

For audio and lower radio frequencies, generation of the temporal waveform is most convenient. For higher frequencies, the use of I and Q components or envelope and phase is preferable. The processor may be a general-purpose type, or one made especially for DSP.

The components or parameters of the NCSP can be fixed for fixed, known loads, or they can be variable or adaptable for unknown or changing loads. The NCSP can also include the effects of other system components, for example, the frequency response of the power amplifier and driver. Adaptation of the parameters of the NCSP begins with sensing of the load impedance or related parameters such as voltage and current. If the equivalent circuit of the load is known, then component values are extracted from a small set of impedance measurements. If the equivalent circuit of the load is unknown, a somewhat larger set of impedance measurements is processed through standard techniques to extract an equivalent circuit. The NCSP is then configured (if necessary) to simulate the extracted equivalent circuit with negative components and/or reverse-order connections, as required by the application.

Combining Multiple Amplifiers (Diplexing and Multiplexing)

The subject invention overcomes the limitations of previously available techiques by allowing the outputs of multiple power amplifiers that operate in overlapping frequency bands to be combined into the same load. The combining (also known as diplexing or multiplexing) is achieved without inherent loss. with flat system frequency response, continuous frequency coverage through the transition from one amplifier to the other, and with resistive, matched load impedances presented to the amplifiers so that they operate efficiently and with mininum voltage and current stress (minimum ratings).

Figure 15:
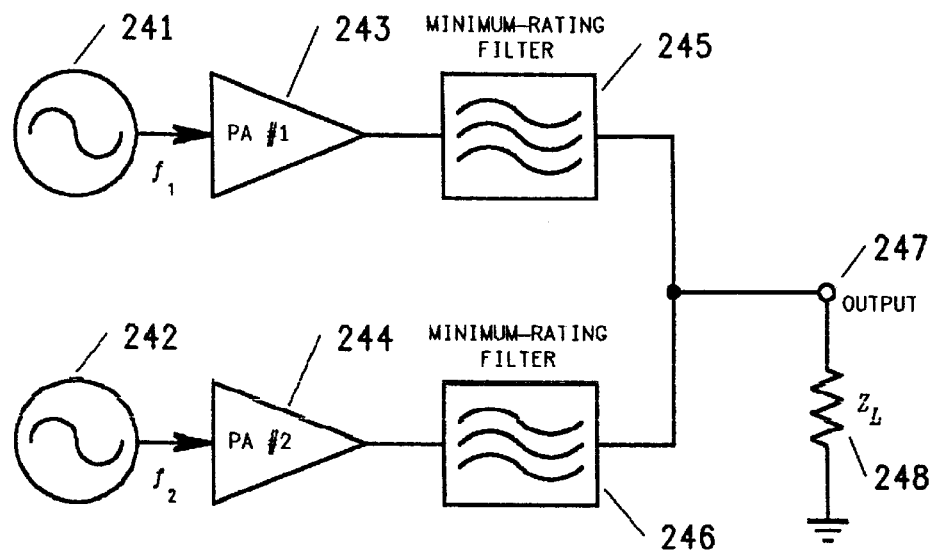
FIG. 15 illustrates combination of the outputs of separate amplifiers through minimum-rating filters.
Figure 16:
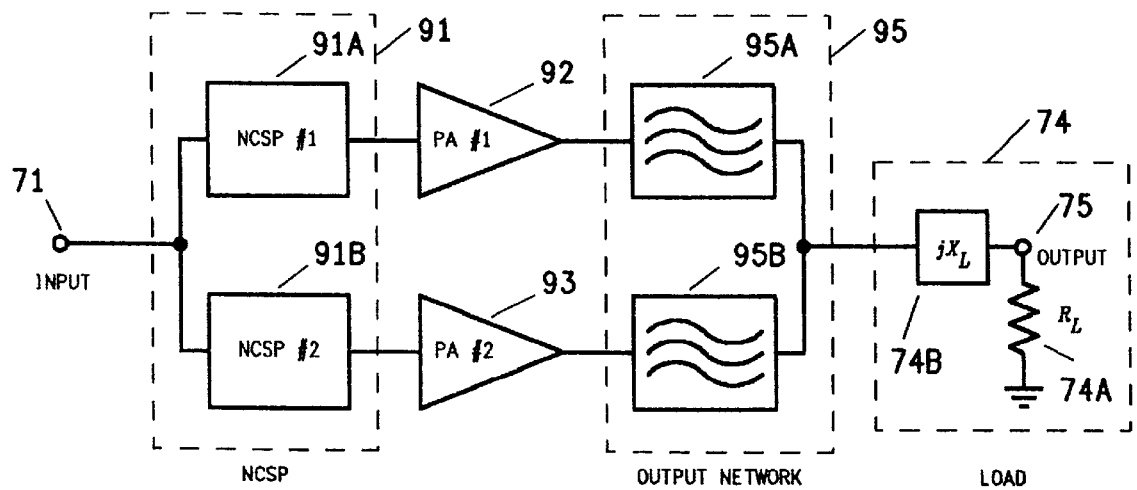
FIG. 16 illustrates the use of an NCSP for diplexed operation of two power amplifiers.

A diplexing system with almost continuous coverage can be implemented by combining the outputs of two amplifiers through a pair of minimum-rating filters as shown in FIG. 15. The first MR filter 245 may be a low-pass or band-pass filter that passes signals up to frequency $f_1$. Second MR filter 246 may be a high-pass or band-pass filter that passes signals at frequency $f_2$ and above, where $f_2 > f_1$. The output terminal of filter 245 has a high impedance to signals at frequency of $f_2$ and above, while the output terminal of filter 246 has a high impedance to signals at frequencies of $f_1$ and below. Consequently, neither filter loads the other within its operating band and each amplifiers drives the load as if the other did not exist. The use of MR filters provides the aforementioned benefits of maximum bandwidth with minimum ratings for a given power delivered to the load.

Figure 17:
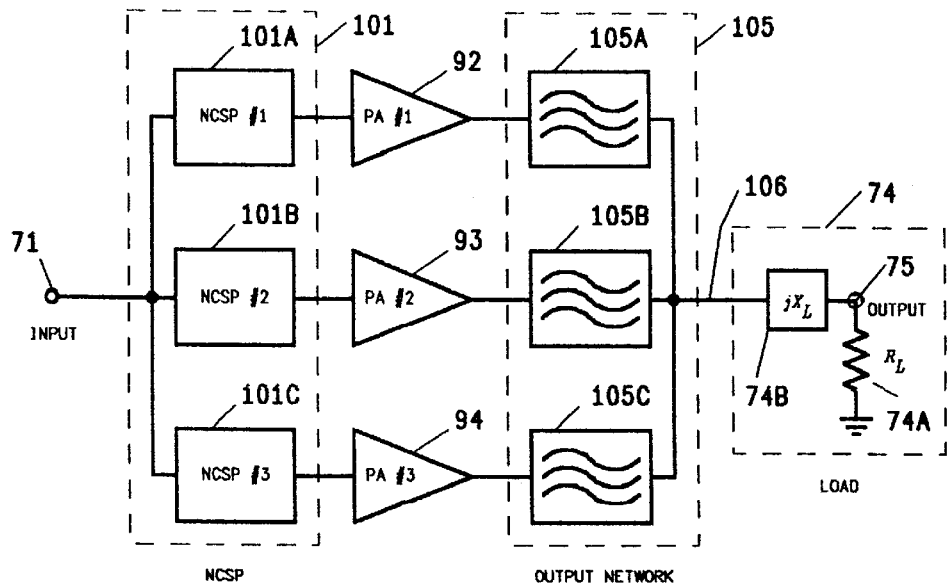
FIG. 17 illustrates a parallel-coupling technique for multiplexing of three or more amplifiers.
Figure 18:
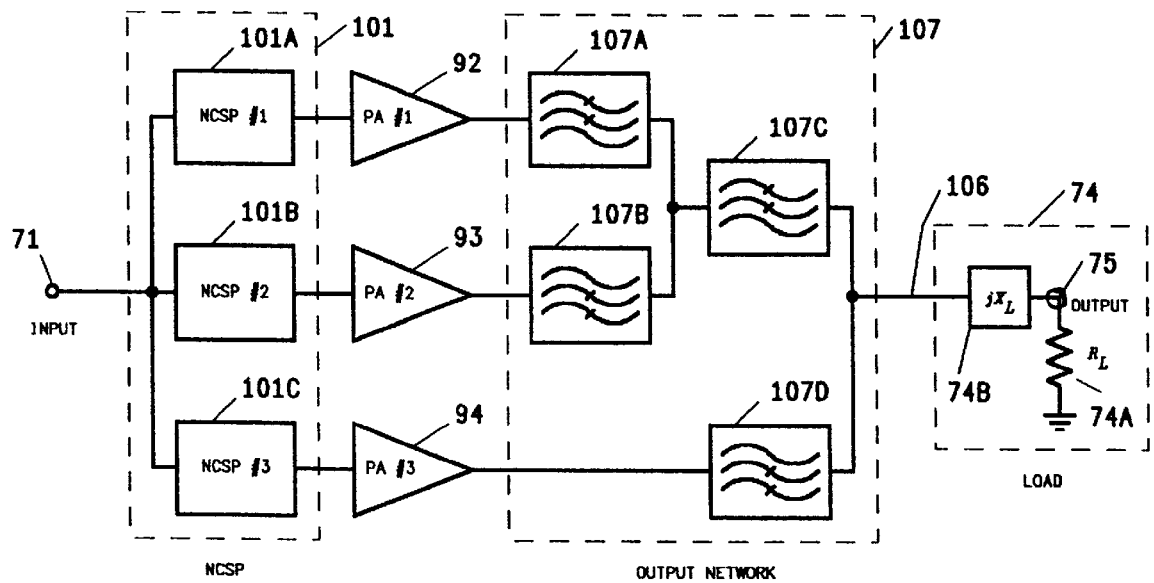
FIG. 18 illustrates a series-coupling technique for multiplexing of three or more amplifiers.

The outputs of the MR filters can be coupled to the load either in parallel (as shown) or in series (using transformers). For parallel coupling, the output terminals of the filters must present high impedances to out-of-band signals. For series coupling, the output terminals must present low impedances to out-of-band signals. This technique is readily extended to more than two amplifiers through the topologies illustrated in FIG. 17 and FIG. 18.

Figure 7:
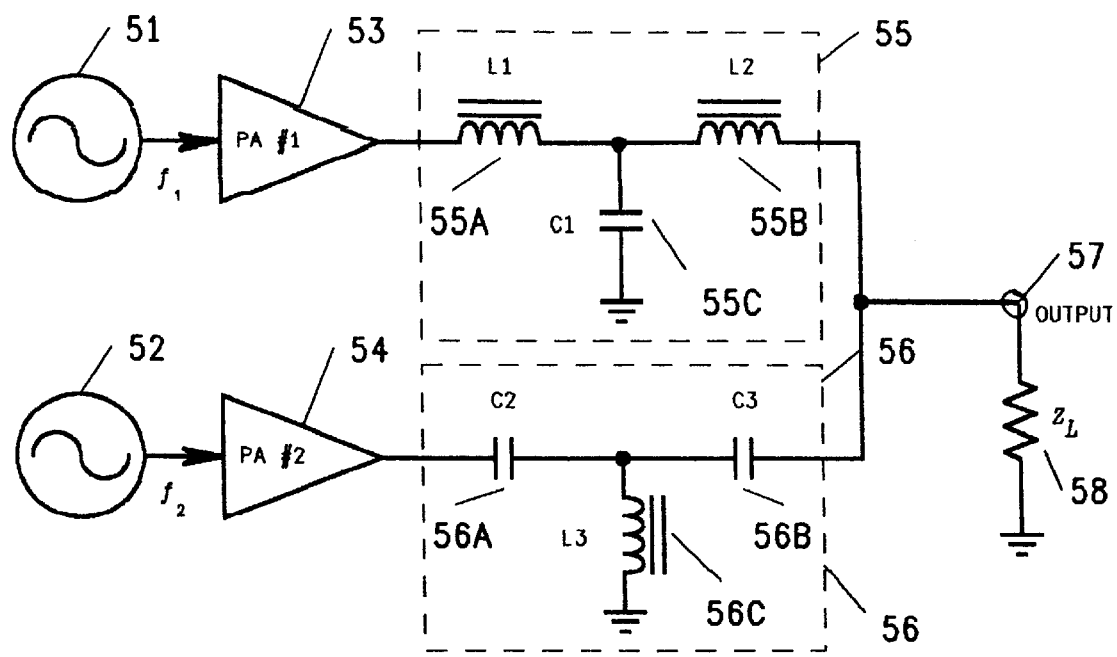
FIG. 7 shows the use of a wideband combining diplexer.
Figure 34:
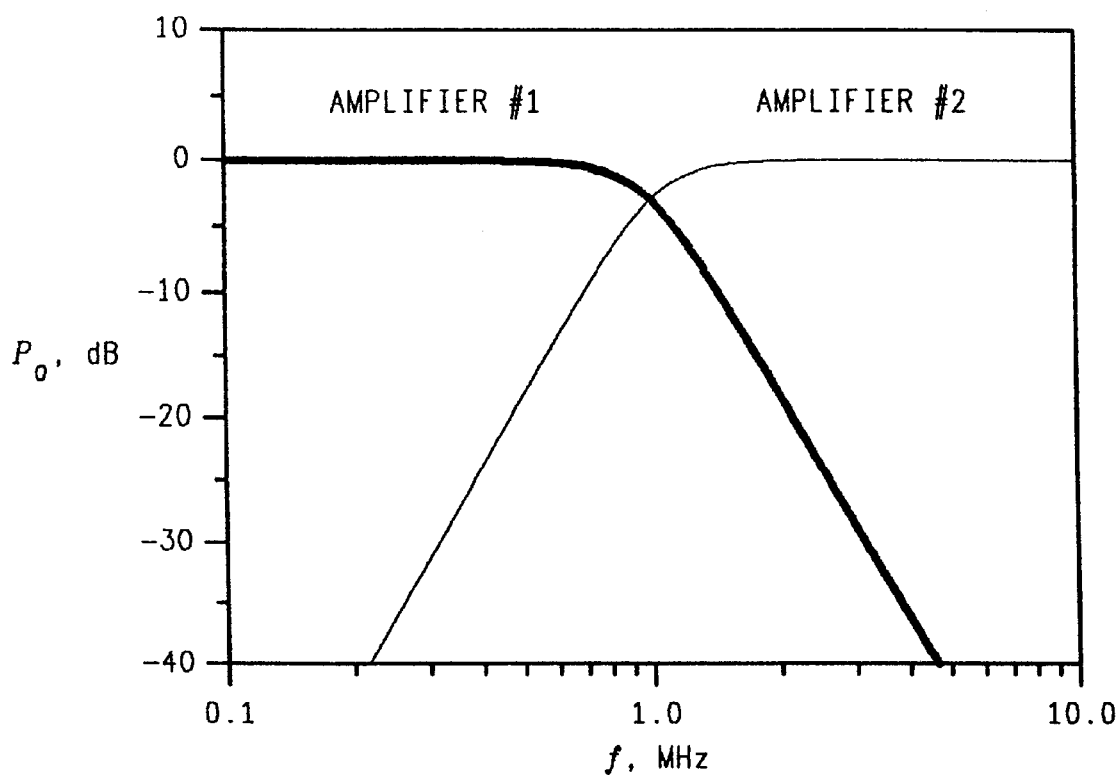
FIG. 34 depicts desirable variations of the power output from two amplifiers in a diplexing combiner.

In a diplexing system with continuous frequency coverage (e.g., FIG. 7), one amplifier is used primarily for frequencies below the transition frequency and may be optimized for that band of frequencies. The second amplifier is used primarily for frequencies above the transition frequency and may be optimized for the higher band of frequencies. It is therefore desirable for the output of the first amplifier to fall-off gradually near and above the transition frequency, as shown in the example of FIG. 34. Similarly, it is desirable for the output from the second amplifier to decrease gradually at frequencies below the transition frequency. The transition frequency (1 MHz in FIG. 34) is the frequency at which both amplifiers contribute equally to the system output.

Figure 8:
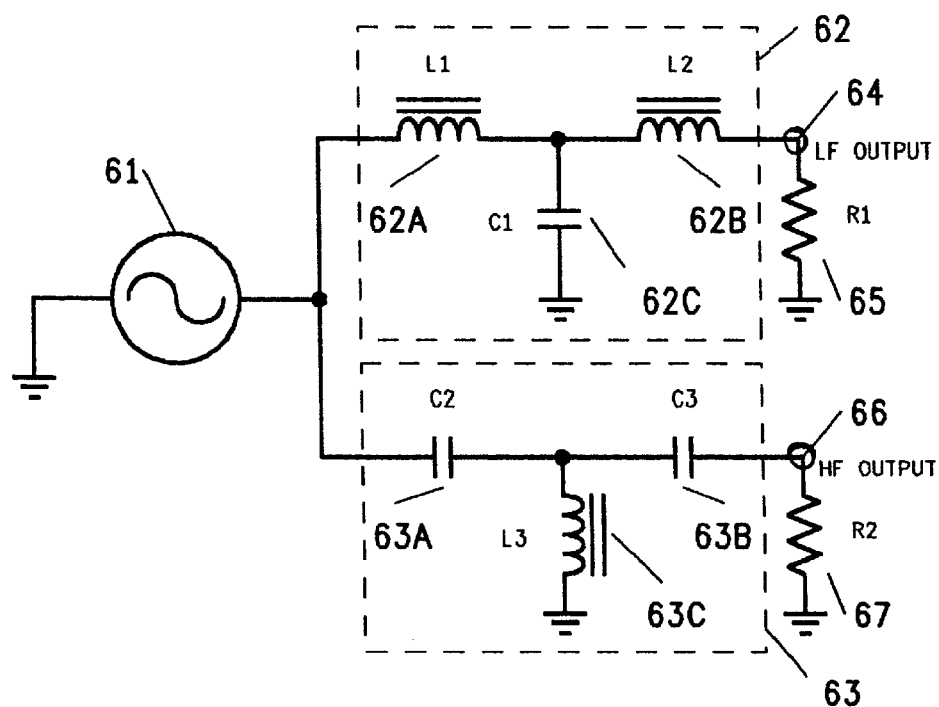
FIG. 8 illustrates a splitting diplexer.
Figure 9A:
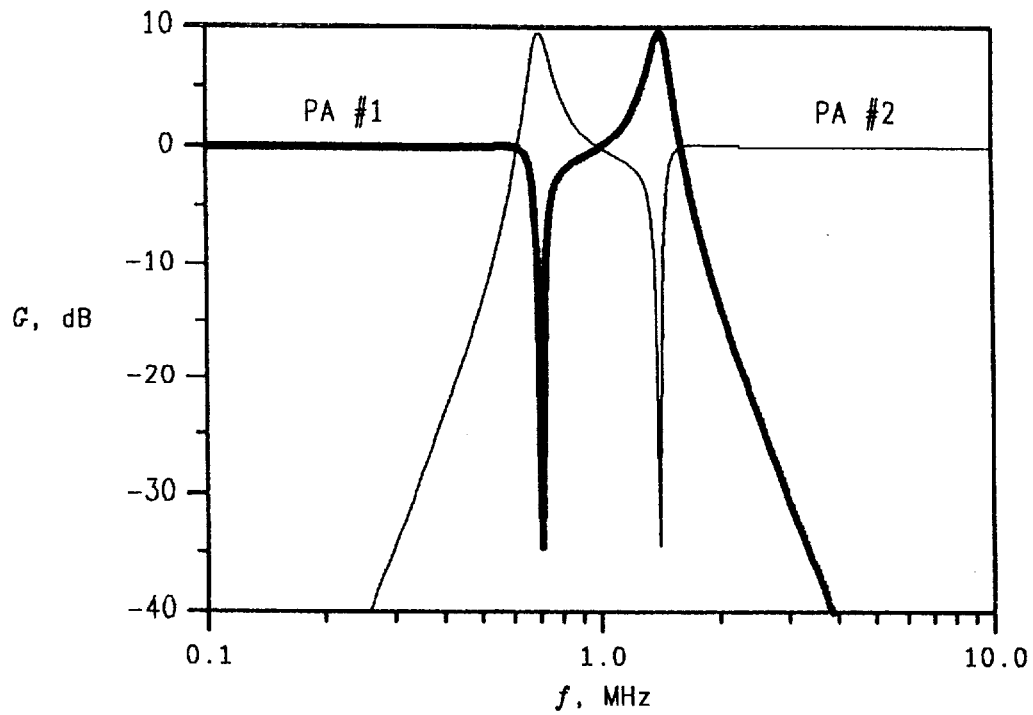
FIG. 9A shows an example of the frequency response (gain) obtained with a prior-art combining diplexer.
Figure 9B:
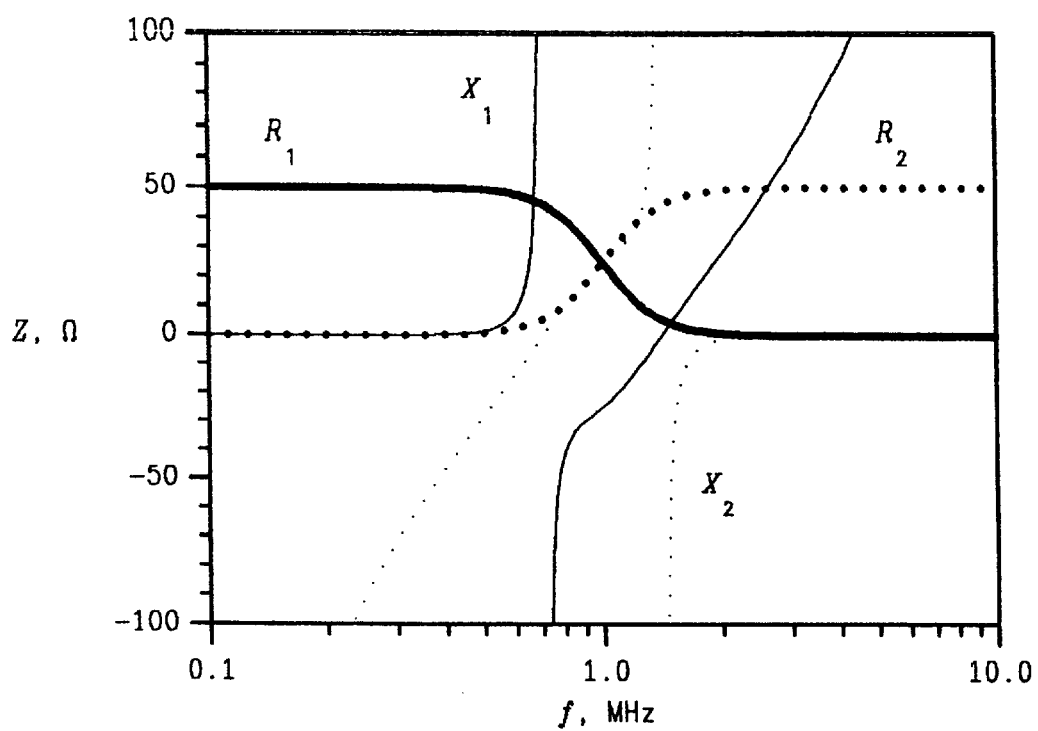
FIG. 9B shows the corresponding variations in amplifier-load impedances.
Figure 10:
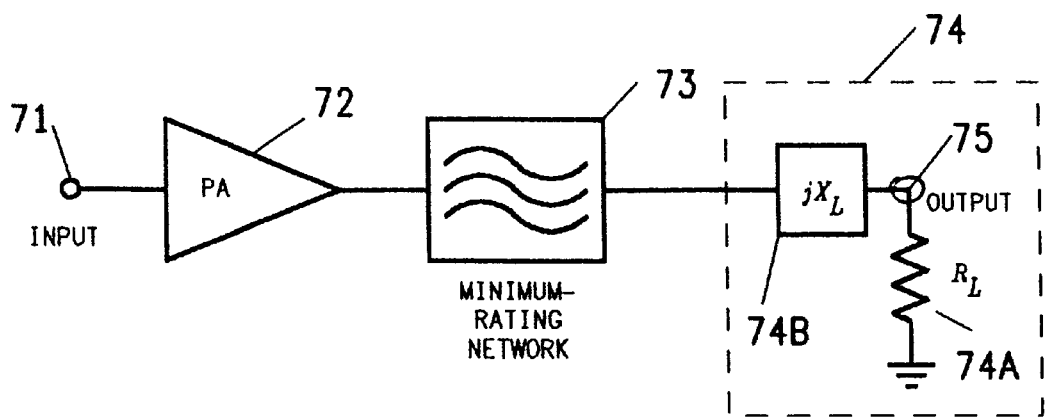
FIG. 10 illustrates the first structural embodiment of the invention in which an amplifier is coupled to the load through a minimum-rating filter or matching network to achieve minimum amplifier ratings over the frequency band of operation.
Figure 35A:
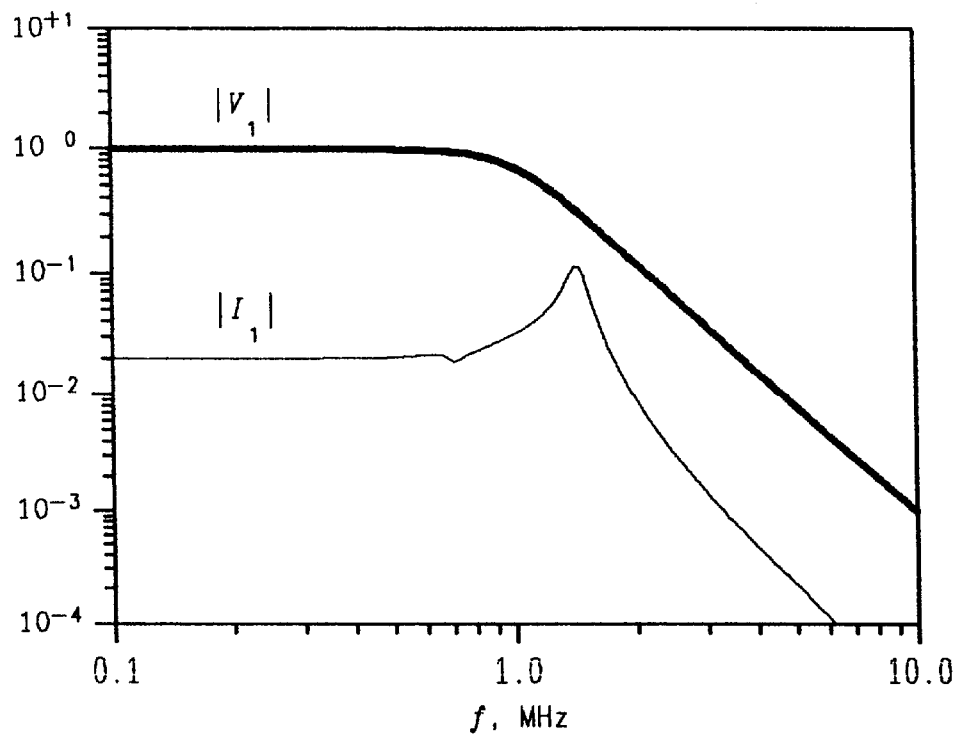
FIG. 35A is an example of the variation of the amplifier voltage and current outputs produced by improper phasing of the driving signals.
Figure 35B:
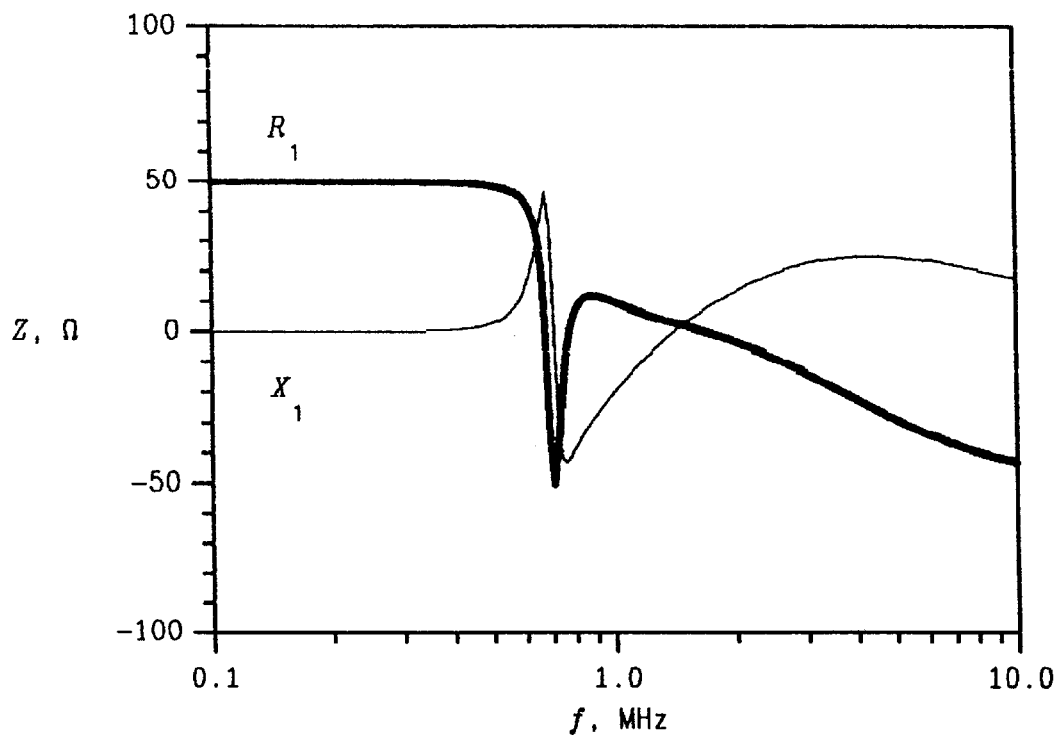
FIG. 35B shows the corresponding amplifier-load impedances.

The amplitudes of the outputs of the splitting diplexer (FIG. 8) vary in the manner of the desired contributions of the two amplifiers to the system output. This suggests using a splitting diplexer as the source of the driving signals in a diplexing combiner. Such a diplexed power-amplifier system produces a constant output (gain) over the whole frequency range. However, the amplifier load impedances vary abruptly near the transition frequency and the resistive components are negative at some frequencies, indicating coupling of power from one PA to the other (FIG. 35A and FIG. 35B). This results in inefficient operation, large voltage and current stresses, possible instability, and possible failure due to the inability of most amplifiers to absorb power supplied by another amplifier.

Figure 36:
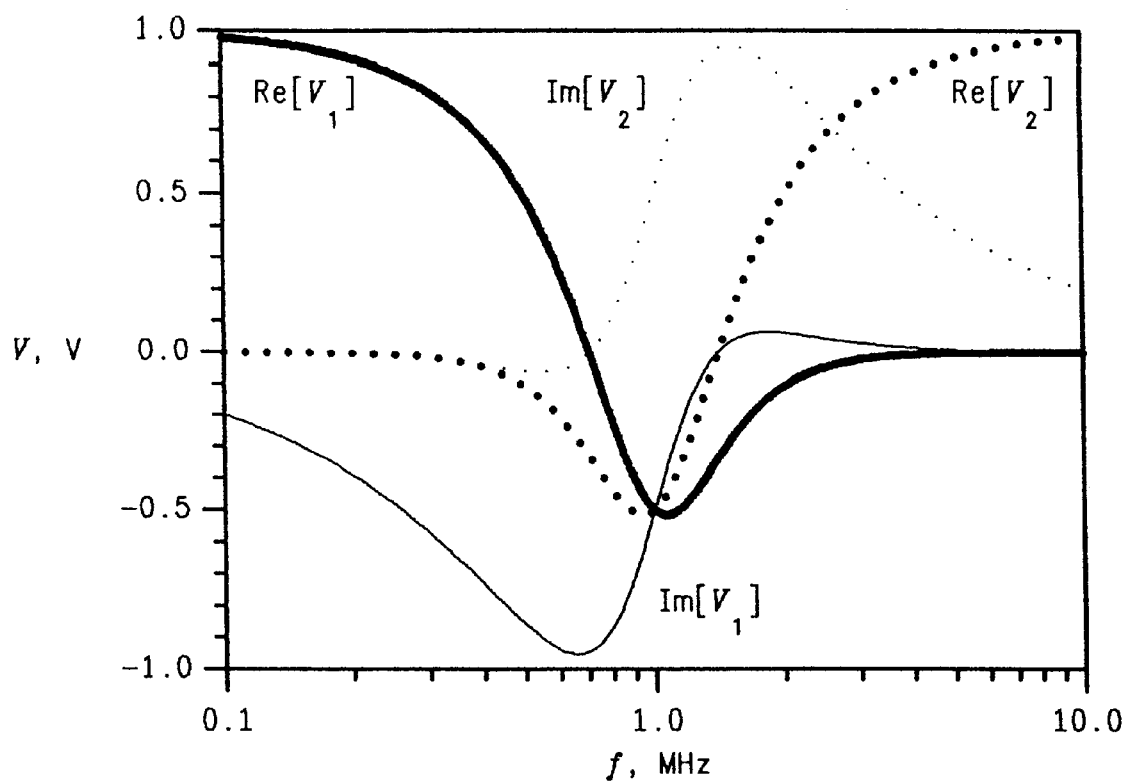
FIG. 36 shows the variation of the I (real) and Q (imaginary) components of the output voltages from a diplexing splitter using physically realizable components.

The use of a splitting diplexer (whether implemented by physical inductors and capacitors or signal-processing techniques) whose elements are identical to those combining filters provides the correct excitation amplitudes but not the correct phases. The variation of the I and Q components of the outputs of a splitting diplexer implemented with physical components are shown in FIG. 36 as functions of frequency.

The proper amplitudes and phases can be provided by an input filter of the same topology as the output filter, but with negative components. Such a network automatically provides the correct excitation whether the input consists of a single tone, multiple tones, or a broad spectrum. The voltages at the output of this splitter are analogous to those shown in FIG. 36 with the signs of the reactances reversed.

Figure 37:
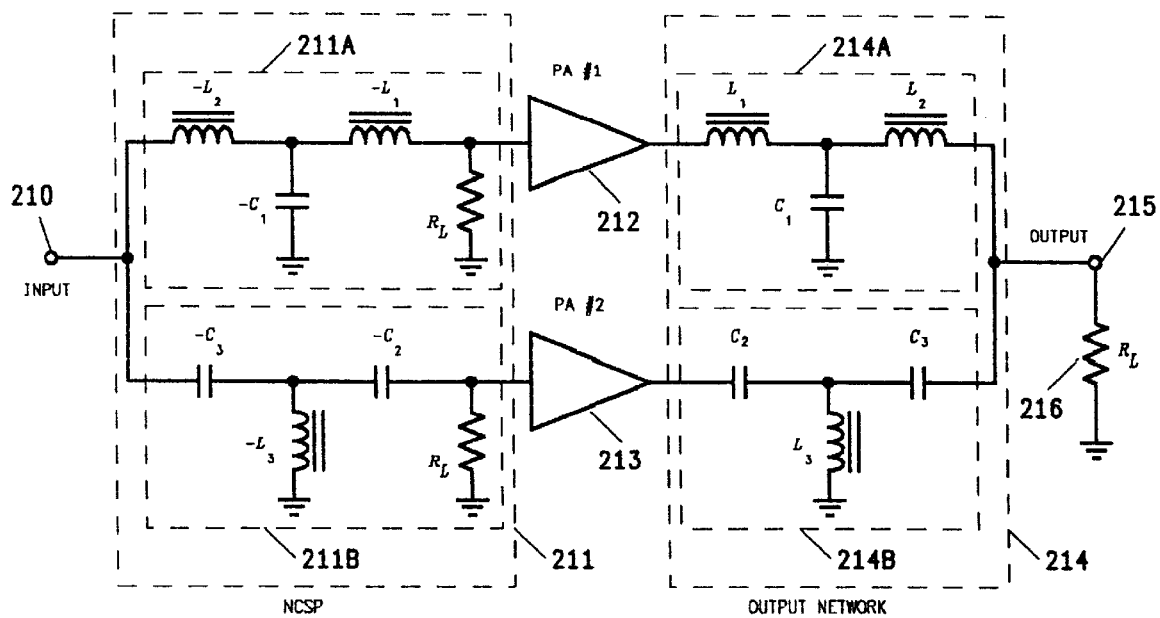
FIG. 37 is a block diagram of the basic embodiment of a diplexing combiner using negative-component signal processing to generate the drive signals.

The diplexing-combiner system illustrated in FIG. 37 is a basic embodiment of this invention. The input signal at 210 is processed by negative-component signal processor 211 to obtain driving signals for amplifiers 212 and 213. The outputs of amplifiers 212 and 213 are combined by output network 214, whose output 215 is applied to load 216. Output network 214 consists of low-pass filter 214A and high-pass filter 214B, which are of the same type (e.g., Butterworth) and have the same cut-off frequency (i.e., they are complementary). NCSP 211 comprises subnetworks 211A and 211B. NCSP subnetwork 211A has the same topology and load resistance as output subnetwork 214A, but the values of its components are negative. Similarly, NCSP subnetwork 211B has the same topology and load resistance as output subnetwork 214B, and again the values of its components are negative.

Figure 38:
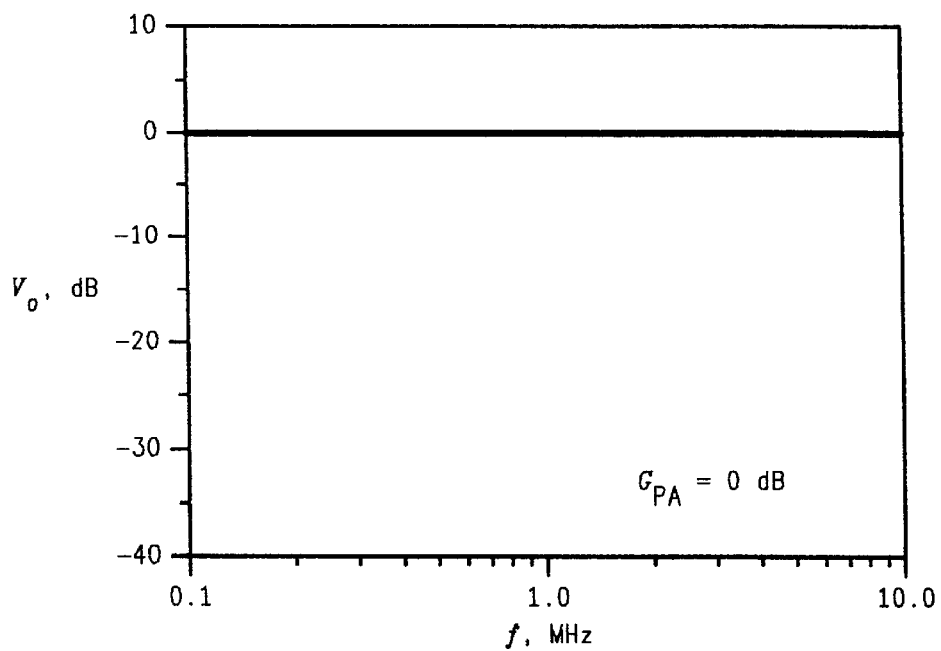
FIG. 38 shows the output of a diplexing-combiner system when the driving signals are of the correct amplitude and phase, as provided by the invention.
Figure 39A:
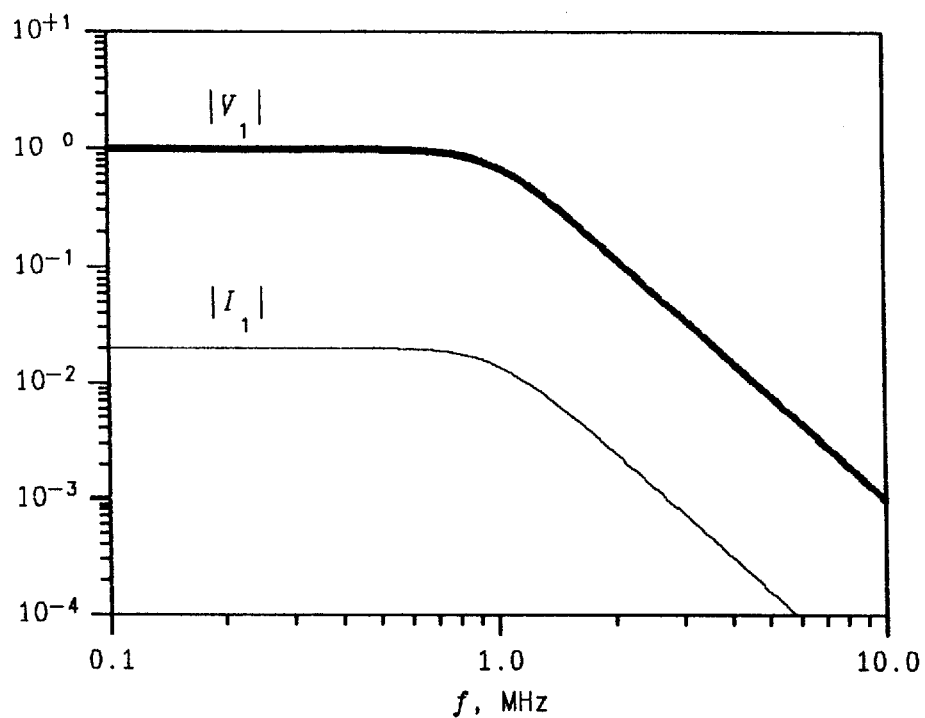
FIG. 39A shows the amplifier output voltage and current produced by the invention.
Figure 39B:
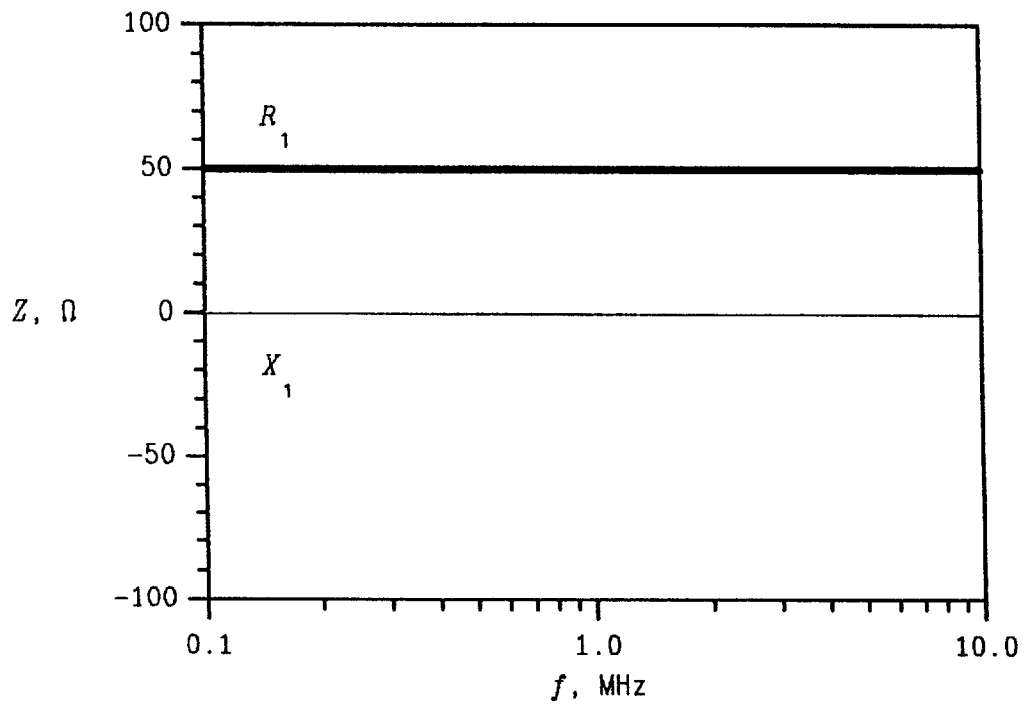
FIG. 39B shows the corresponding amplifier-load impedance.

The excitation produced by this network results in a system output that is constant as shown in FIG. 38. The voltage and current at the outputs of the two amplifiers maintain a constant ratio (FIG. 39A), resulting in a constant, resistive load impedance (FIG. 39B). Further the power outputs from the two amplifiers vary as desired (FIG. 34).

This invention can take on a variety of forms, and in general must be adapted to particular applications. As discussed previously, the basic diplexer embodiment is readily extended to multiplexers incorporating any number of amplifiers.

The production of excitation signals with correct amplitude and phase is important only for signals in band near the transition frequency. At lower and higher frequencies, the unused PA can simply be turned off with minimal degradation of system performance. The NCSP system can incorporate other system characteristics in addition to those of the output filters; for example, amplifier gain and load impedance.

Figure 40:
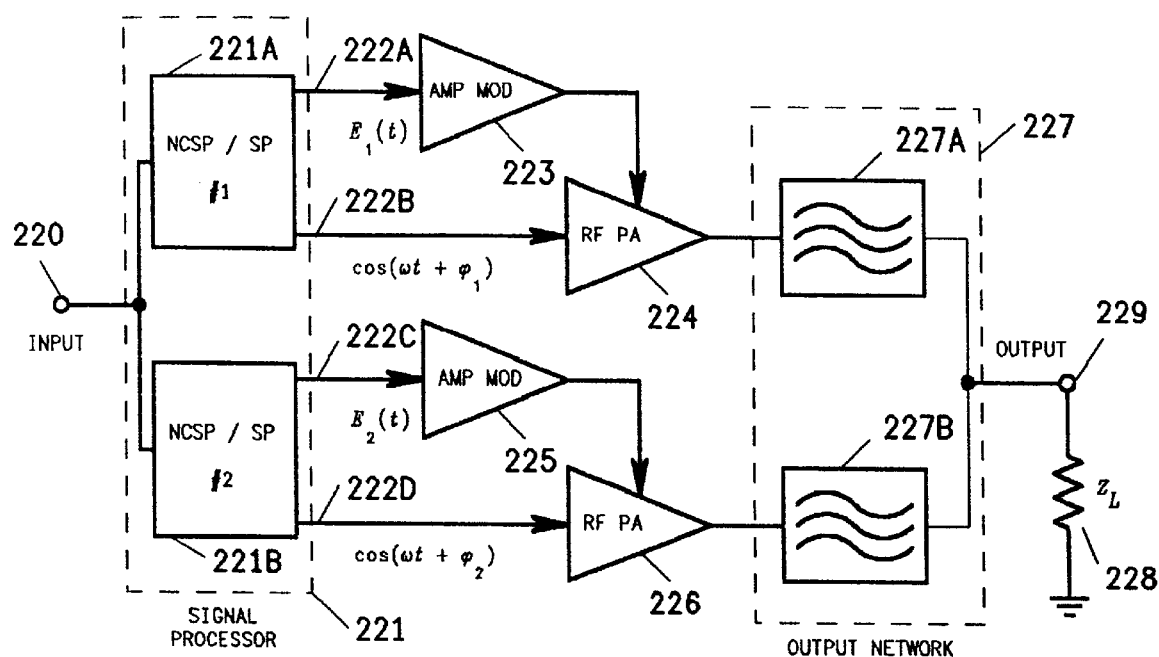
FIG. 40 illustrates an embodiment of the invention that uses high-level amplitude modulation and saturated RF-power amplifiers.

When saturated amplifiers are used, high-level amplitude modualtion is preferable to variation of the drive amplitude as a means of controlling the amplifier output, as shown in FIG. 40. Signal processor 221 includes two subprocessors 221A and 221B. Subprocessor 221A includes negative-component signal processing to match output subnetwork 226A, and subprocessor 221B includes NCSP to match output subnetwork 226B. In response to input 220, subprocessors 221A and 221B first perform negative-component signal processing and then convert the results into envelope and phase information. Envelope information is in turn used to generate envelope signals 222A and 222C that drive high-level amplitude modulators 223 and 225. Phase information is used to generate phase-modulated carriers 222B and 222D that drive RF power amplifiers 224 and 226. The outputs of amplitude modulator 223 varies the amplitude of the signal produced by amplifier 224, and amplitude modulator 225 similarly controls the amplitude of the output of amplifier 226. The outputs of the amplifiers are combined into load 229 by output network 227. Optionally, the RF-power amplifiers can be operated close to saturation instead of in saturation. In this case, the signal processor supplies driving signals of the desired amplitudes.

Various other kinds of power amplifiers can be used in the invention, and different amplifiers can be used in the same system. For example, the Meinzer split-band modulator, a class-S power amplifier is used for low frequencies while a linear (class A, B, G, etc.) power amplifier is used for high frequencies. When high efficiency is desired, high-efficiency RF power amplifiers such as classes C, D, E, and F can be used, or a high-efficiency power-amplifier system such as the Kahn EER technique, envelope tracking, Doherty, or outphasing can be used. Techniques such as feedforward, feedback, and predistortion can be used to improve linearity. These techniques are known to persons skilled in the state of the art and are described in numerous papers and books, for example *Solid State Radio Engineering* (New York: Wiley, 1980). Depending upon the technique, the NCSP may produce one or more waveform outputs and/or one or more modulation outputs. In some cases, the output of the NCSP may be in digital form and in others in analog form.

INDUSTRIAL APPLICABILITY

The applications of the invention include not only radio-frequency power amplification, but also to audio-frequency and microwave power amplification, servo amplifiers, small-signal amplifiers, induction heating, magnetic-resonance imaging, industrial-scientific-medical (ISM) applications, sonar, and other uses of wideband signals. The invention provides a means of driving power into a load while minimizing the ratings of the amplifier, flattening the frequency response through negative-component signal generation, and combining multiple amplifiers while producing a flat frequency response and resistive input impedance.

The description of the embodiments of the present invention is given above for the understanding of the present invention. It will be understood that the invention is not limited to the particular embodiments described herein. The invention is capable of various modifications, rearrangements, and substitutions that will now become apparent to those skilled in the art. For example, several of the functional elements illustrated in the schematics may be combined in integrated-circuit implementations performing the same functions, and the improvements provided by the present invention can be combined with other techniques, including those noted above such as feedback and load-impedance monitoring. Various types of amplifier (class A, B, C, D, E, F, G, S, pulse-step, or hybrid combinations) can be used to implement the technique, and amplifiers can be used with high-level modulators. Various types of filter characteristics (Butterworth, Chebyshev) can be used, as can various filter implementations (lumped-element, transmission-line, or combination), and the filters can through well-known techniques be adapted to low-pass, high-pass, band-pass, band-stop, and other applications, and can be designed to have either high or low out-of-band impedances. The negative-component signal processing can be implemented as noted above by synthesizers with look-up tables, active circuits, digital-signal processors, or other techniques. Various elements can also be combined to advantage; for example, the output filter of the class-S modulator and the low-pass filter of the diplexing combiner can be the same.

What is claimed is:

1. A method for coupling an input signal to a load through an electronic network, said network having n components, an input, and an output and said output being coupled to the load, said method comprising: the n steps of selecting each of the n components of said network so that the input of the network has a minimum-rating characteristic, whereby a specified amount of signal power is delivered to the load at any frequency within a specified frequency band with input voltage and input current no larger than specified ratings.

2. An electronic network operable by the method recited in claim 1.

3. A system comprising an amplifier and the network of claim 2, the amplifier being coupled to the input of the network.

4. A network as recited in claim 2, further comprising a load-sensing means for measuring load characteristics and means for varying values of the components of the network in response to said load characteristics, whereby the minimum-rating, impedance, and attenuation characteristics of the network are maintained.

5. A system comprising an amplifier and the network of claim 4, the amplifier being coupled to the input of the network of claim 4.

6. A method for filtering using an electronic network as recited in claim 1, wherein the components of the network are further chosen so that the network has specified filtering characteristics, said filtering characteristics including attenuation and impedance.

7. An electronic filter operable by the method recited in claim 6.

8. A system comprising an amplifier and the network of claim 7, the amplifier being coupled to the input of the network of claim 7.

9. A method for impedance transformation and matching using an electronic network as recited in claim 1, wherein the components of the network are further chosen so that the network provides impedance transformation and matching.

10. A matching network operable by the method recited in claim 9.

11. A system comprising an amplifier and the network of claim 10, the amplifier being coupled to the input of the network of claim 10.

12. A method for broadbanding using an electronic network as recited in claim 1, wherein the components of the network are further chosen so that the network expands the bandwidth over which power can be delivered to the load.

13. A broadbanding network operable by the method recited in claim 12.

14. A system comprising an amplifier and the network of claim 13, the amplifier being coupled to the input of the network of claim 13.

15. A method for amplifying multiple signals and delivering amplified signals to a load through a system, said system having one or more inputs and a single output, the system comprising:
(a) multiple amplifiers and
(b) multiple output networks;
the system being organized so that:
 (i) each system inputs is coupled to one individual amplifiers,
 (ii) the output of each amplifier is coupled to an network,
 (iii) the outputs of the output networks are coupled to the system output, and
 (iv) the system output is coupled to the load:
said method comprising for each network the n steps of selecting each of the n components of said network so that the input of each network has a minimum-rating characteristic,
and the passbands of each network being separated so that one network does not significantly load another network significantly;
whereby each amplifier delivers a specified amount of signal power to the load at any frequency within a specified frequency band with input voltage and input current no larger than specified ratings.

16. A system operable by the method recited in claim 15.

17. A system as recited in claim 16 in which the network outputs are coupled in parallel to the load.

18. A system as recited in claim 16 in which the network outputs are coupled in series to the load.

19. A system as recited in claim 16, further comprising one or more load-sensing means for measuring load characteristics and one or more means for varying values of the components of the output networks in response to said load characteristics, whereby the minimum-rating, impedance, and attenuation characteristics of the output networks are maintained.

20. A method for coupling an input signal to a load through an electronic network, said network having n components, one or more inputs, and an output and said output being coupled to the load, said method comprising:
the n steps of selecting each of the n components of said network so that the input of the network has a minimum-rating characteristic, whereby a specified amount of signal power is delivered to the load at any frequency within a specified frequency band with input voltage and input current no larger than specified ratings.

21. A method for coupling an input signal to a load through an electronic network and delivering a specified amount of signal power to the load at any frequency within a specified frequency band, said network having n components, an input, and an output and said output being coupled to the load, said method comprising the n steps of: selecting each of the n components of said network so that the input of the network has a minimum-rating characteristic, whereby said specified amount of signal power is delivered to the load at any frequency within a specified frequency band with input voltage and input current no larger than specified ratings.

22. A method for delivering multiple signals to a load through a system, said system having one or more system inputs and a system output, said system comprising multiple output networks;
the system being organized so that:
 (i) each system input is coupled to an-output-network input,
 (ii) the output-network outputs are coupled to the system output, and
 (iii) the system output is coupled to the load;
said method comprising for each output network the n steps of selecting each of the n components of said network so that the input of each network has a minimum-rating characteristic, and the passbands of each network being separated so that one network does not significantly load another network significantly;
whereby each amplifier delivers a specified amount of signal power to the load at any frequency within a specified frequency band with input voltage and input current no larger than specified ratings.

* * * * *